(12) United States Patent
Miyakawa et al.

(10) Patent No.: US 7,332,034 B2
(45) Date of Patent: Feb. 19, 2008

(54) COATING APPARATUS AND COATING METHOD USING THE SAME

(75) Inventors: Takuya Miyakawa, Nagano-ken (JP); Shinya Momose, Nagano-ken (JP); Takayuki Suzuki, Saitama-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/992,093

(22) Filed: Nov. 19, 2004

(65) Prior Publication Data

US 2005/0191420 A1 Sep. 1, 2005

(30) Foreign Application Priority Data

| Nov. 21, 2003 | (JP) | ............................. 2003-391670 |
| Dec. 26, 2003 | (JP) | ............................. 2003-434506 |
| Dec. 26, 2003 | (JP) | ............................. 2003-434507 |
| Dec. 26, 2003 | (JP) | ............................. 2003-434508 |
| Jan. 13, 2004 | (JP) | ............................. 2004-005756 |

(51) Int. Cl.
*B05B 7/06* (2006.01)
*B05B 13/06* (2006.01)
*B05C 5/00* (2006.01)
*B05C 3/00* (2006.01)

(52) U.S. Cl. ..................... 118/313; 118/306; 118/304; 118/401

(58) Field of Classification Search ............... 118/306, 118/317, 305, 52, 612, 313–316, 304, 410, 118/401; 257/276; 239/568
See application file for complete search history.

(56) References Cited

U.S. PATENT DOCUMENTS 3,158,503 A * 11/1964 Young ....................... 427/98.3
5,529,634 A * 6/1996 Miyata et al. .............. 118/726
6,268,619 B1 * 7/2001 Kosaki et al. .............. 257/276

FOREIGN PATENT DOCUMENTS

| JP | 5-155030 A | 6/1993 |
| JP | 6-343908 A | 12/1994 |
| JP | 11319678 A | * 11/1999 |
| JP | 2003-2604406 A | 9/2003 |

OTHER PUBLICATIONS

English Translated Abstract 11-319678.*

* cited by examiner

*Primary Examiner*—Yewebdar Tadesse
(74) *Attorney, Agent, or Firm*—Sughrue Mion, PLLC

(57) ABSTRACT

To provide a coating apparatus, which can surely prevent a coating solution from spreading, to simplify a manufacturing process and reduce the manufacturing cost and provide a coating method using the same. The coating apparatus includes a holding table holding a plate having a through hole penetrating in a thickness direction; and a coating head including a slit-shaped nozzle orifice which discharges a coating solution, the nozzle orifice being opposed to a coating surface opposite to a holding surface held on the holding table. The coating apparatus applies the coating solution to the coating surface of the plate by moving the plate and the coating head relative to each other in an in-plane direction of the coating surface. In addition, the coating apparatus includes coating preventing means, which prevents the coating solution from entering the through hole of the plate.

5 Claims, 23 Drawing Sheets

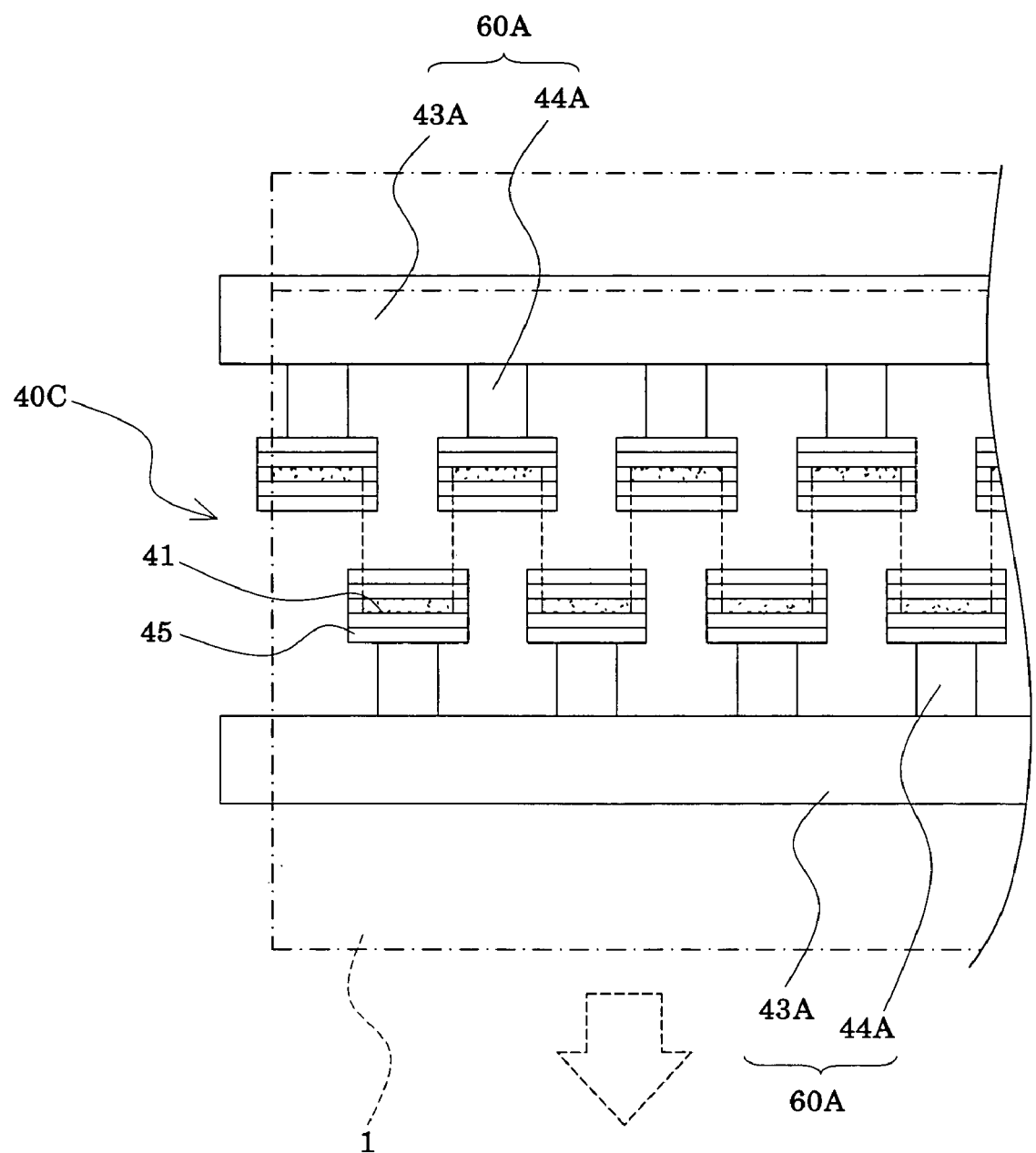

COATING APPARATUS AND COATING METHOD USING THE SAME

BACKGROUND OF THE INVENTION

1. Field of the invention

The present invention relates to a coating apparatus which discharges a coating solution from an edge of a coating head and moves the coating head and a base plate relative to each other in an in-plane direction of a coating surface of the base plate to coat the coating surface with the coating solution. In addition, the present invention relates to a coating method using the coating apparatus.

2. Description of the Background Art

As a coating apparatus for coating a plate such as a semiconductor wafer or a glass plate with a coating solution such as a resist material or an insulating material, the Japanese Patent Laid-open publication No. 6-343908 discloses a slit coater which discharges the coating solution from an edge of a nozzle orifice due to a capillary action to apply the coating solution to the surface of the plate.

For example, a MEMS (micromachine), a printer, or the like generally uses a component with a through hole penetrating in a thickness direction. Therefore, in the case of applying a resist material to one side of a plate with through holes to form a resist film, there is a problem in that the resist material spreads to an unnecessary region including a surface opposite to the coating surface through the through holes and the like. Such defects are conspicuous especially when the resist material is a positive resist since only part struck by an electron beam becomes soluble in a chemical reaction.

Moreover, the coating solution such as a resist material having spread to the unnecessary region of the plate cannot be easily removed. Removing the application solution in the unnecessary region requires another working step, leading to high cost.

Furthermore, if the coating solution spreads to a surface of the plate opposite to the coating surf ace, the coating solution adheres to a holding table which holds the plate. Then, there is a problem in that when a new plate is held in the holding table, the coating solution adheres to the surface of the new plate opposite to the coating surface. This requires work in washing the holding table every time the plate is replaced.

As a method which does not cause such defects, the Japanese Patent Laid-Open publication No. 5-155030 discloses a method of forming a resist film before forming through holes. However, such a method involves a problem of increasing the number of steps, and moreover, the process is complicated. Furthermore, there is another problem in that a film made of such a material that would not be damaged in forming the through holes cannot be patterned.

SUMMARY OF THE INVENTION

The present invention was made in the light of such circumstances, and an object of the present invention is to provide a coating apparatus which can surely prevent a coating solution from spreading to simplify a manufacturing process and reduce the manufacturing cost and is to provide a coating method using the same.

A first aspect of the present invention to solve the aforementioned problem is a coating apparatus including a holding table holding a plate having a through hole penetrating in a thickness direction; and a coating head including a slit-shaped nozzle orifice which discharges a coating solution, the nozzle orifice facing a coating surface opposite to a holding surface held on the holding table. In the coating apparatus, the plate and the coating head a removed relative to each other in an in-plane direction of the coating surface to apply the coating solution on the coating surface of the plate. In addition, the coating apparatus includes coating preventing means which prevents the coating solution from entering the through hole of the plate.

According to the first aspect, the coating solution can be applied to a uniform thickness without applying the coating solution to a region on the plate corresponding to the through hole. This can prevent the coating solution from spreading to the unnecessary regions including the inside of the through hole and holding surface of the plate, thus eliminating the step of removing the coating solution in the unnecessary region. Accordingly, the manufacturing process can be simplified, and the manufacturing cost can be reduced.

A second aspect-of the present invention is a coating apparatus according to the first aspect, characterized in that the coating preventing means forms a repellent film on an inner surface of the through hole.

According to the second aspect, the coating solution is prevented by the repellent film from adhering to the inner surface of the through hole. Moreover, even if the coating solution enters the through hole, the coating solution is repelled by the repellent film and can be easily removed.

A third aspect of the present invention is a coating apparatus according to the first or second aspect, characterized in that the coating preventing means forms the repellent film on the holding surface of the plate.

According to the third aspect, the repellent film can be easily and surely formed within the through hole.

A fourth aspect of the present invention is a coating apparatus according to the second aspect, characterized in that the coating preventing means sprays a repellent solution to be the repellent film from the holding surface side.

According to the fourth aspect, the repellent solution can be selectively applied to the inside of the through hole only by spraying the coating solution from the holding surface side. This eliminates the step of patterning of the repellent solution or the like. Accordingly, the manufacturing process can be simplified.

A fifth aspect of the present invention is a coating apparatus according to any one of the first to fourth aspects, characterized by including drying means for drying the coating solution.

According to the fifth aspect, with the drying means, a film can be formed more surely for a shorter time.

A sixth aspect of the present invention is a coating apparatus according to any one of the first to fifth aspects, characterized in that the coating head applies a coating solution to be formed into a resist film to the plate.

According to the sixth aspect, the present invention is suitably used for forming the resist film on the plate.

A seventh aspect of the present invention is a coating apparatus according to the first aspect, characterized in that the coating preventing means is blowing means for blowing gas into the through hole of the plate from the holding surface side toward the coating surface side.

According to the seventh aspect, blowing the gas into the through hole provided in the plate from the holding surface side toward the coating surface side enables the coating solution to be applied to a uniform thickness without applying the coating solution in a region corresponding to the through hole of the plate. This can prevent the coating solution from spreading to unnecessary regions including the inside of the through hole and holding surface of the plate, thus eliminating the step of removing the coating solution in the unnecessary regions. Accordingly, the manufacturing process can be simplified, and the manufacturing cost can be reduced.

An eighth aspect of the present invention is a coating apparatus according to the first aspect, characterized in that the coating preventing means includes an elastic film and pressurization means. The elastic film is provided in the region of the holding table corresponding to the through hole and has repellency at least on a side of the through hole. The pressurization means elastically deforms the elastic film in a bag shape within the through hole so as to block at least an opening of the through hole on the coating surface side.

According to the eighth aspect, elastically deforming the elastic film within the through hole in a bag shape can prevent the coating solution from spreading to unnecessary regions including the inside of the through hole and holding surface of the plate 1, thus eliminating the step of removing the coating solution in the unnecessary regions. Accordingly, the manufacturing step can be simplified, and the manufacturing cost can be reduced.

A ninth aspect of the present invention is a coating apparatus according to the eighth aspect, characterized in that the elastic film has repellency due to a repellent film provided on the surface on the coating surface side.

According to the ninth aspect, the repellent film prevents the coating solution from being applied on the elastic film. Accordingly, even if the elastic film is pulled out from the through hole, the coating solution can be prevented from entering the through hole.

A tenth aspect of the present invention is a coating apparatus according to the eighth and ninth aspect, characterized in that the pressurization means elastically deforms the elastic film in a bag shape by blowing gas from a side of the elastic film opposite to the plate.

According to the tenth aspect, the elastic film can be easily elastically deformed by blowing. Moreover, through holes different in size can be treated.

An eleventh aspect of the present invention is a coating apparatus according to any one of the eighth to tenth aspects, characterized in that a blowing hole connected to the pressurization means is provided in a region of the holding table corresponding to the through hole.

According to the eleventh aspect, the pressurization means can easily blow gas into the through hole from the holding surface side toward the coating surface side through the blowing hole.

A twelfth aspect of the present invention is a coating apparatus according to the first aspect, characterized in that a plurality of the nozzle orifices are aligned in a direction intersecting with the moving direction of the coating head, and the coating preventing means is selection means for selecting on/off of discharge of the coating solution from each nozzle orifice to selectively stop the discharge.

According to the twelfth aspect, by stopping the discharge of the coating solution from a nozzle orifice in a region corresponding to the through hole provided in the plate, the coating solution can be applied on the plate without being applied to a region on the plate corresponding to the through hole. This can prevent the coating solution from spreading to an unnecessary region including the inside of the through hole and holding surface of the plate, thus eliminating the step of removing the coating solution in the unnecessary region. Accordingly, the manufacturing process can be simplified, and the manufacturing cost can be reduced.

A thirteenth aspect of the present invention is a coating apparatus according to the twelfth aspect, characterized in that the reservoir means keeps a plurality of different coating solutions, and each nozzle orifice is provided so as to discharge any one of the plurality of different coating solutions.

According to the thirteenth aspect, the different coating solutions can be applied to the coating surface of the plate, and thickness and a pattern of the coating solutions can be minutely decided.

A fourteenth aspect of the present invention is a coating apparatus according to the twelfth or thirteenth aspect, characterized in that the selection means selectively stops supply of the coating solution from the reservoir means keeping the coating solutions to the coating head.

According to the fourteenth aspect, the supply of the coating solutions to the coating head is controlled by the selection means, and therefore discharge of the coating solutions from the nozzle orifices can be selectively stopped easily.

A fifteenth aspect of the present invention is a coating apparatus according to any one of the twelfth to fourteenth aspects, characterized in that a plurality of nozzle rows each including a plurality of the nozzle orifices aligned are provided in the moving direction.

According to the fifteenth aspect, the plurality of nozzle rows enables the time for applying the coating solutions to be shortened.

A sixteenth aspect of the present invention is a coating apparatus according to any one of the twelfth to fifteenth aspects, characterized in that the coating head includes a plurality of individual heads each having a nozzle orifice and each of the individual heads is provided so that the distance between the nozzle orifice and the plate is adjustable.

According to the sixteenth aspect, the coating solutions can be applied by the plurality of individual heads in a predetermined pattern to have thickness varying in an in-plane direction.

A seventeenth aspect of the present invention is a coating apparatus according to any one of the twelfth to sixteenth aspects, characterized in that the selection means includes a flow rate adjustment function to adjust the flow rate of the coating solution discharged from each nozzle orifice.

According to the seventeenth aspect, the amount of coating solution discharged from each nozzle orifice can be adjusted, and the coating solutions can be applied in a predetermined pattern to have thickness varying in an in-plane direction.

An eighteenth aspect of the present invention is a coating method provided with a holding table holding a plate having a through hole penetrating in a thickness direction; and a coating head including a nozzle orifice which charges a coating solution, the nozzle orifice facing a coating surface opposite to a holding surface. The coating method is characterized by moving the plate and the coating head relative to each other in an in-plane direction of the coating surface to apply the coating solution on the coating surface other than an inner surface of the through hole.

According to the eighteenth aspect, the coating solution can be applied to a uniform thickness without being applied to an region on the plate corresponding to the through hole. This can prevent the coating solution from spreading to the unnecessary region including the inside of the through hole or holding surface of the plate, thus eliminating the step of removing the coating solution in the unnecessary region. Accordingly, the manufacturing process can be simplified, and the manufacturing cost can be reduced.

A nineteenth aspect of the present invention is a coating method according to the eighteenth aspect, characterized in that the coating solution is applied to the coating surface other than the inner surface of the through hole by forming a repellent film in the through hole.

According to the nineteenth aspect, the repellent film can prevent the coating solution from being applied to the inner surface of the through hole. Moreover, even if the coating solution enters the through hole, the coating solution is repelled by the repellent film and can be easily removed.

A twentieth aspect of the present invention is a coating method according to the nineteenth aspect, characterized in that a contact angle of the coating solution to the repellent film is not less than 50 degrees.

According to the twentieth aspect, the coating solution can be more efficiently prevented from spreading to the holding surface side.

A twenty-first aspect of the present invention is a coating method according to any one of the eighteenth to twentieth aspects, characterized in that the coating solution is applied to the plate to form a resist film.

According to the twenty-first aspect, the present invention is suitably used for forming the resist film on the plate.

A twenty-second aspect of the present invention is a coating method according to the twenty-first aspect, characterized in that average thickness of the resist film is 0.3 to 5 μm.

According to the twenty-second aspect, a function of the resist film can be more suitably exerted.

A twenty-third aspect of the present invention is a coating apparatus according to the eighteenth aspect, characterized in that the coating solution is applied to the coating surface other than the inner surface of the through hole by blowing gas into the through hole from a holding surface side of the plate opposite to the coating surface toward the coating surface side.

According to the twenty-third aspect, by blowing the gas into the through hole provided in the plate from the holding surface side toward the coating surface side, the coating solution can be applied to a uniform thickness without being applied to the coating solution in a region corresponding to the through hole of the plate. This can prevent the coating solution from spreading to an unnecessary region including the inside of the through hole and holding surface of the plate, thus eliminating the step of removing the coating solution in the unnecessary region. Accordingly, the manufacturing process can be simplified, and the manufacturing cost can be reduced.

An twenty-fourth aspect of the present invention is a coating method according to the eighteenth aspect, characterized in that the coating solution is applied to the coating surface other than the inner surface of the through hole by elastically deforming an elastic film in a bag shape within the through hole so as to block at least an opening of the through hole on the coating surface side. Herein, the elastic film is provided in a region corresponding to the through hole and has repellency at least on a side of the through hole.

According to the twenty-fourth aspect, elastically deforming the elastic film within the through hole in a bag shape can prevent the coating solution from spreading to an unnecessary region including the inside of the through hole and holding surface of the plate 1, thus eliminating the step of removing the coating solution in the unnecessary region. Accordingly, the manufacturing step can be simplified, and the manufacturing cost can be reduced.

A twenty-fifth aspect of the present invention is a coating method according to the eighteenth aspect, characterized in that a plurality of the nozzle orifices are aligned in a direction intersecting with the moving direction of the coating head, and the coating solution is applied on the coating surface other than the inner surface of the through hole by selecting on/off of discharge of the coating solution from each nozzle orifice to selectively stop the discharge.

According to the twenty-fifth aspect, by stopping the discharge of the coating solution from a nozzle orifice in a region corresponding to the through hole provided in the plate, the coating solution can be applied to the plate without being applied to the region on the plate corresponding to the through hole. This can prevent the coating solution from spreading to an unnecessary region including the inside of the through hole and holding surface of the plate, thus eliminating the step of removing the coating solution in the unnecessary region. Accordingly, the manufacturing process can be simplified, and the manufacturing cost can be reduced.

BRIEF DESCRIPTION OF THE DRAWINGS

FIG. 23 is a plan view showing a modified example of the coating apparatus according to the embodiment 6 of the present invention.

DETAILED DESCRIPTION OF THE INVENTION

Hereinafter, a description is given of the present invention in detail based on embodiments.

Embodiment 1

Figure 1:
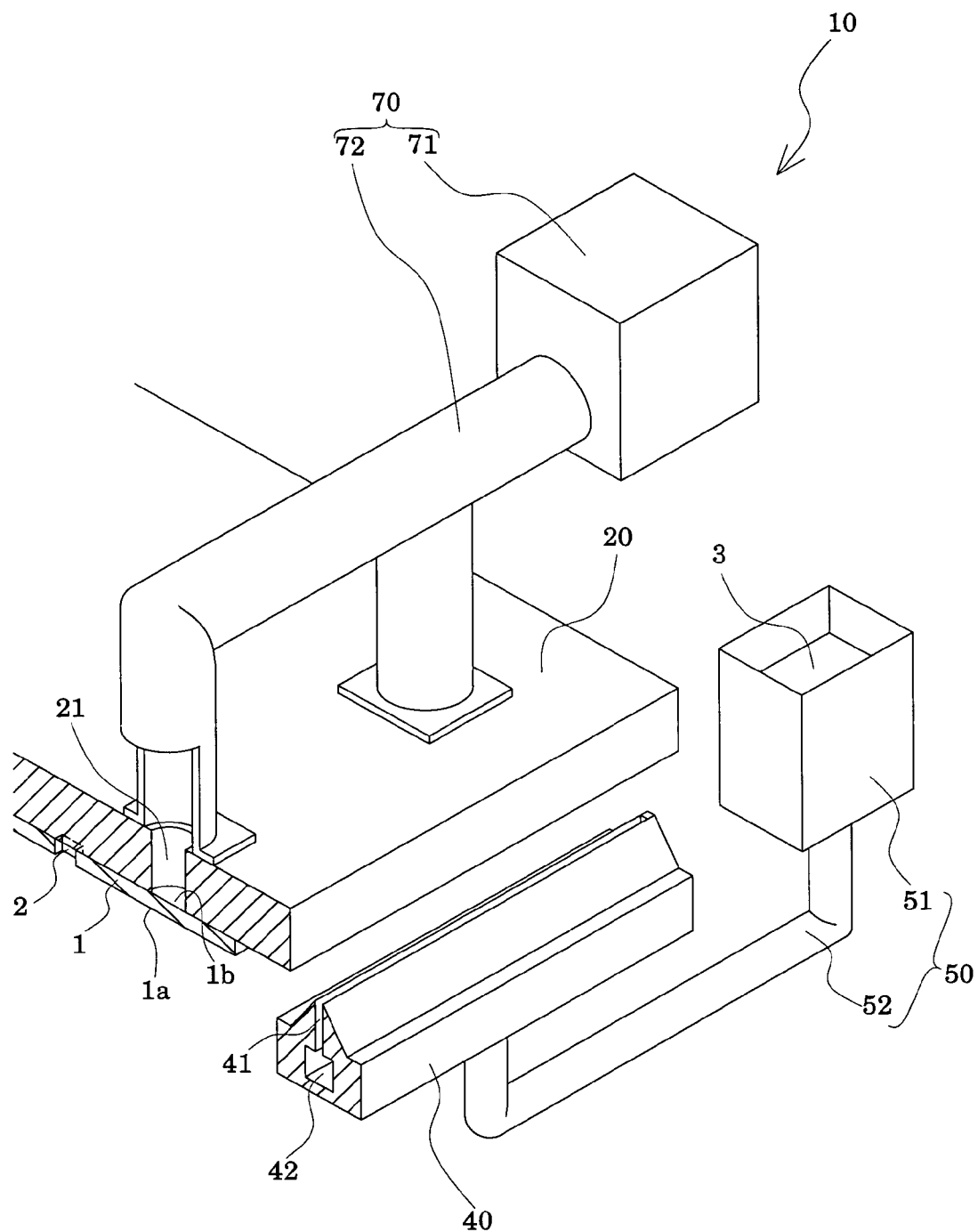
FIG. 1 is a plan view schematically showing a construction of a coating apparatus according to an embodiment 1 of the present invention.

FIG. 1 is a cross sectional view showing a coating apparatus according to an embodiment 1 of the present invention. As shown in FIG. 1, in a plate 1 such as a silicon wafer or a semiconductor plate, a through hole 2 penetrating in a thickness direction is formed. In a state where the inside of the through hole 2 of the plate 1 is coated with a repellent solution, a coating solution 3 is applied to a coating surface 1a of the plate 1 by means of a slit coater. In other words, the coating apparatus of this embodiment includes coating preventing means which coats the inside of the through hole 2 with the repellent solution.

Herein, an example of a coating apparatus 10 is described. The coating apparatus 10 of this embodiment is a slit coater. The coating apparatus 10 includes a holding table 20 on which a holding surface 1b side of the plate 1 is held; a coating head 40 provided on the plate 1 side of the holding table 20; and reservoir means 50 supplying the coating solution 3 to the coating head 40.

The holding table 20 holds the plate 1 on a vertically lower side with the coating surface 1a vertically down. The way in which the holding table 20 holds the plate 1 is not particularly limited. For example, in this embodiment, suction means 70 is provided, and the suction means 70 includes a suction pump 71 such as a vacuum pump and a suction pipe 72. One end of the suction pipe 72 is connected to the suction pump 71, and the other end thereof is connected to a suction hole 21 so as to communicate with the same. The suction hole 21 penetrates the holding table 20 in the thickness direction. The suction means 70 holds the holding surface 1b, which is opposite to the coating surface 1a of the plate 1, by vacuum suction. By holding the plate 1 on the holding table 20 by suction of the suction means 70, the plate 1 can be easily held on the holding table 20. In addition, a member holding the plate 1 and the like do not protrude on the coating surface 1a side of the plate 1, and the coating solution 3 can be therefore easily applied to the plate 1. The holding table 20 holds the holding surface 1b side of the plate 1 such that the suction hole 21 does not communicate with the through hole 2.

On the other hand, on the coating surface 1a side of the plate 1 held by the holding table 20, the coating head 40 which applies the coating solution 3 to the coating surface 1a and the reservoir means 50 keeping the coating solution 3, which is supplied to the coating head 40, are provided. The coating head 40 is provided with a nozzle orifice 41 at a position facing the coating surface 1a of the plate 1. The nozzle orifice 41 is directed vertically upward. From the nozzle orifice 41, the coating solution 3 supplied from the reservoir means 50 is discharged. Within the coating head 40, a solution pool 42 is provided, and the nozzle orifice 41 is uniformly filled with the coating solution 3 by this solution pool 42. In such a coating head 40, when the solution pool 42 is filled with the coating solution 3, the coating solution 3 filled in the solution pool 42 rises to the edge of the nozzle orifice 41 by the capillary action. The coating solution 3 raised to the edge of the nozzle orifice 41 remains protruded from the edge of the nozzle orifice 41 due to the surface tension thereof. The coating head 40 is held by an apparatus body not shown so as to move vertically. The distance between the edge of the coating head 40 and the coating surface 1a of the plate 1 is properly adjusted by the apparatus body according to the kinematic viscosity or wettability to the plate 1 of the coating solution 3.

The reservoir means 50 includes a reservoir tank 51 keeping the coating solution 3 and a supply pipe 52. One end of the supply pipe 52 is connected to the coating head 40, and the other end thereof is connected to the reservoir tank 51. The reservoir means 50 supplies the coating solution 3 stored inside the reservoir tank 51 to the coating head 40 through the supply pipe 52. The coating solution 3 supplied from the reservoir means 50 rises to the edge of the nozzle orifice 41 due to the capillary action and remains protruded at the edge of the nozzle orifice 41 due to the surface tension as described above. This protruded coating solution 3 is brought in contact with the coating surface 1a of the plate 1, and the holding table 20 is moved in an in-plane direction of the coating surface 1a of the plate 1. Accordingly, the coating solution 3 is gradually discharged from the nozzle orifice 41, and the coating solution 3 can be applied to the coating surface 1a of the plate 1 at a uniform thickness.

Figure 2:
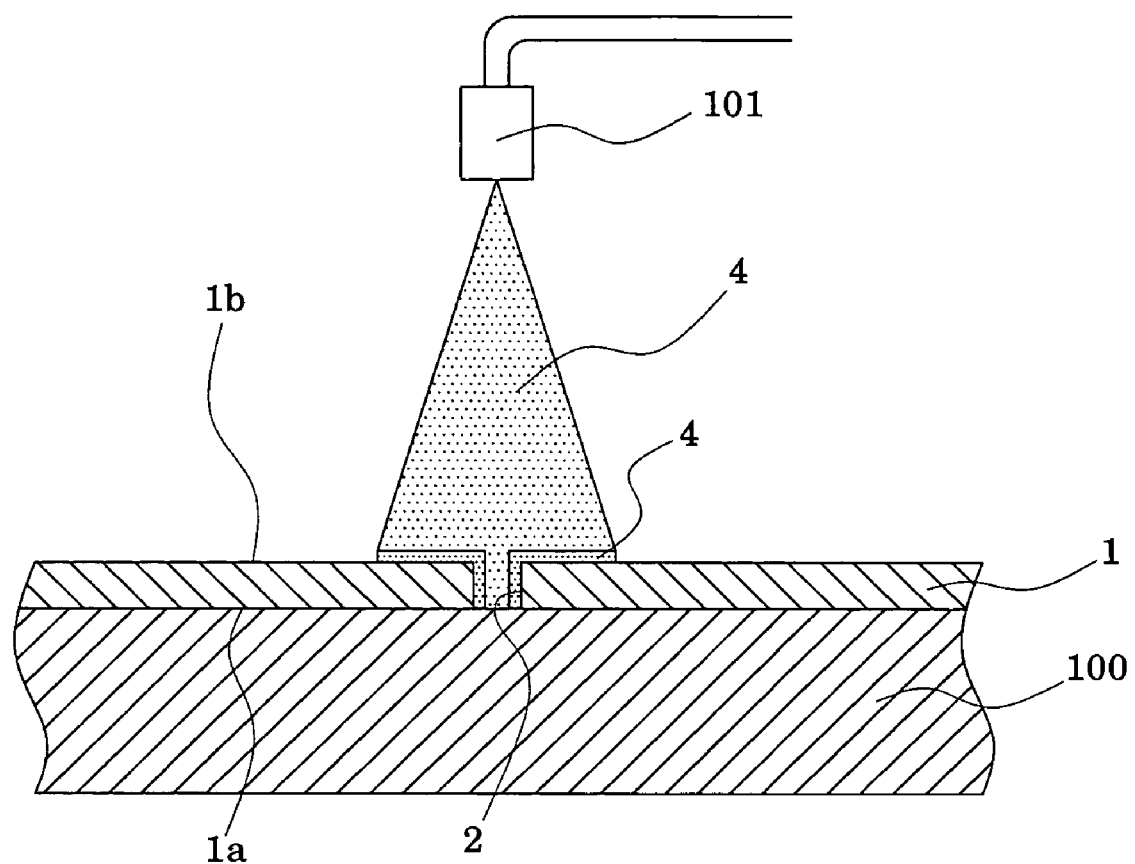
FIG. 2 is a cross-sectional view of a main portion of the coating apparatus showing a coating method according to the embodiment 1 of the present invention.

Herein, a description is given in detail of the coating method using the coating apparatus 10 of this embodiment. FIG. 2, FIGS. 3A and 3B, and FIG. 4 are cross sectional views of a main portion of the coating apparatus, showing the coating method. First, the inner surface of the through hole 2 of the plate 1 is coated with the repellent solution 4. In this embodiment, as shown in FIG. 2, the plate 1 is placed on a stage 100 with the holding surface 1b, which is opposite to the coating surface 1a, vertically up. The repellent solution 4 is selectively sprayed by an injection head 101, which sprays the repellent solution 4, from the holding surface 1b side of the plate 1 on only an region of the holding surface 1b where the through hole 2 is opened to coat the inner surface of the through hole 2 with the repellent solution 4. As described above, the inside of the through hole 2 can be coated with the repellent solution 4 by spraying the repellent solution 4 such as a mist from the holding surface 1b side with the injection head 101. This can eliminate, for example, the need for a step of patterning a repellent film to simplify the manufacturing process. The injection head 101 may inject the repellent solution 4 onto all over the holding surface 1b of the plate 1 to coat the inner surface of the through hole 2 with the repellent solution 4. As the repellent solution 4 to be applied to the inside of the through hole 2, for example, Optool DSX (DAIKIN INDUSTRIES, Ltd.) is used in this embodiment.

Figure 3A:
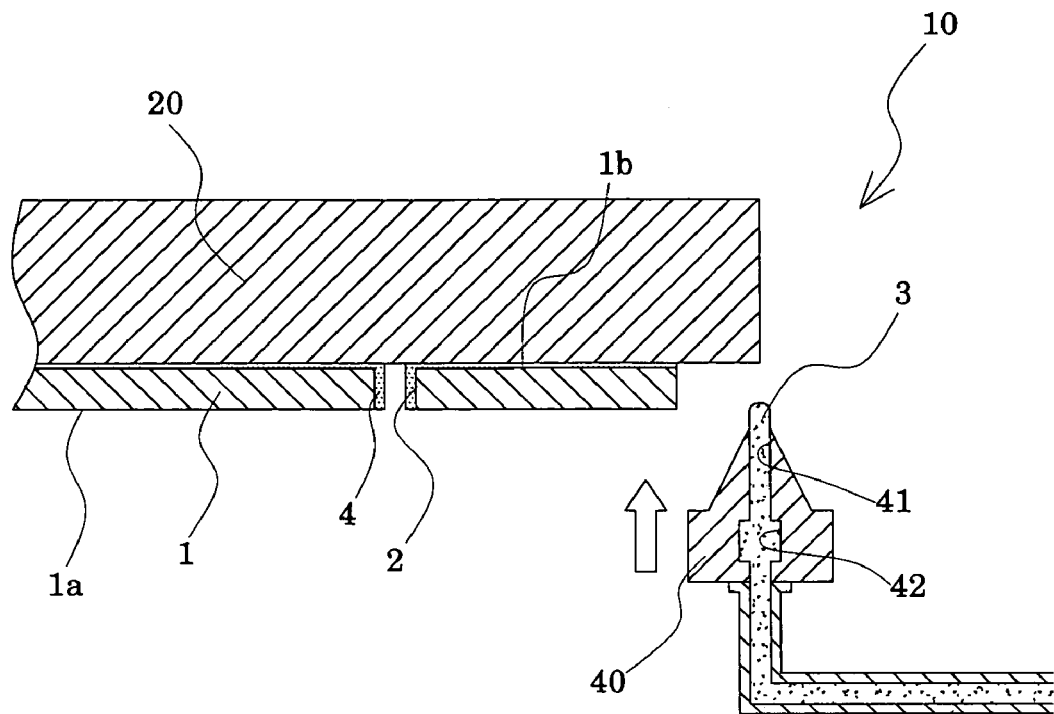
FIGS. 3A and 3B show cross-sectional views of a main portion of the coating apparatus showing the coating method according to the embodiment 1 of the present invention.

Next, using the coating head 40, the coating surface 1a of the plate 1 is coated with the coating solution 3. Specifically, as shown in FIG. 3A, the holding surface 1b side of the plate 1 is held on the holding table 20 to direct the coating surface 1a of the plate 1 vertically downward. The distance between the coating head 40 and the plate 1 is reduced to a predetermined distance with the coating solution 3 protruded from the edge of the nozzle orifice 41 of the coating head 40. In this embodiment, the distance between the coating head 40 and the plate 1 is adjusted by moving the coating head 40 toward the holding table 20. However, the distance between the coating head 40 and the plate 1 may be adjusted by moving the holding table 20 toward the coating head 40 while the coating head 40 is fixed. Certainly, the nozzle orifice 41 of the coating head 40 may be directed in a direction intersecting with the vertical direction.

In a stand-by state before coating, it is possible to prevent the coating solution 3 from drying or being mixed with foreign substances by setting the coating solution 3 not to completely protrude from the edge of the nozzle orifice 41. In order to set the coating solution 3 not to protrude from the edge of the nozzle orifice 41 as described above, the solution pool 42 should not be filled with the coating solution 3. For example, a flow rate adjusting means for adjusting a flow rate of the coating solution 3, such as a feed pump, may be provided for the supply pipe 52. It may be controlled by this flow rate adjusting means whether the solution pool 42 is filled with the coating solution 3 is controlled for a micro-vibration adjustment: whether the coating solution 3 is protruded from the edge of the nozzle orifice 41 to such an extent that the coating solution 3 is not completely protruded or not protruded. Vertically moving the surface of the coating solution 3 kept by the reservoir means 50 with respect to the edge of the nozzle orifice 41 allows micro-vibration of the surface of the solution. This makes it possible to prevent an increase in viscosity of the coating solution 3 at the rim of the nozzle opening 41 which is caused by drying or mixing of foreign matters. A desired amount of coating solution 3 can be therefore discharged from the nozzle orifice 41. Consequently, the coating solution 3 with increased viscosity does not adhere to the rim of the nozzle opening 41. It is preferable to take a measure to prevent the increase in viscosity of the coating solution 3, in particular, when the apparatus remains in the stand-by state for a long time.

Figure 3B:
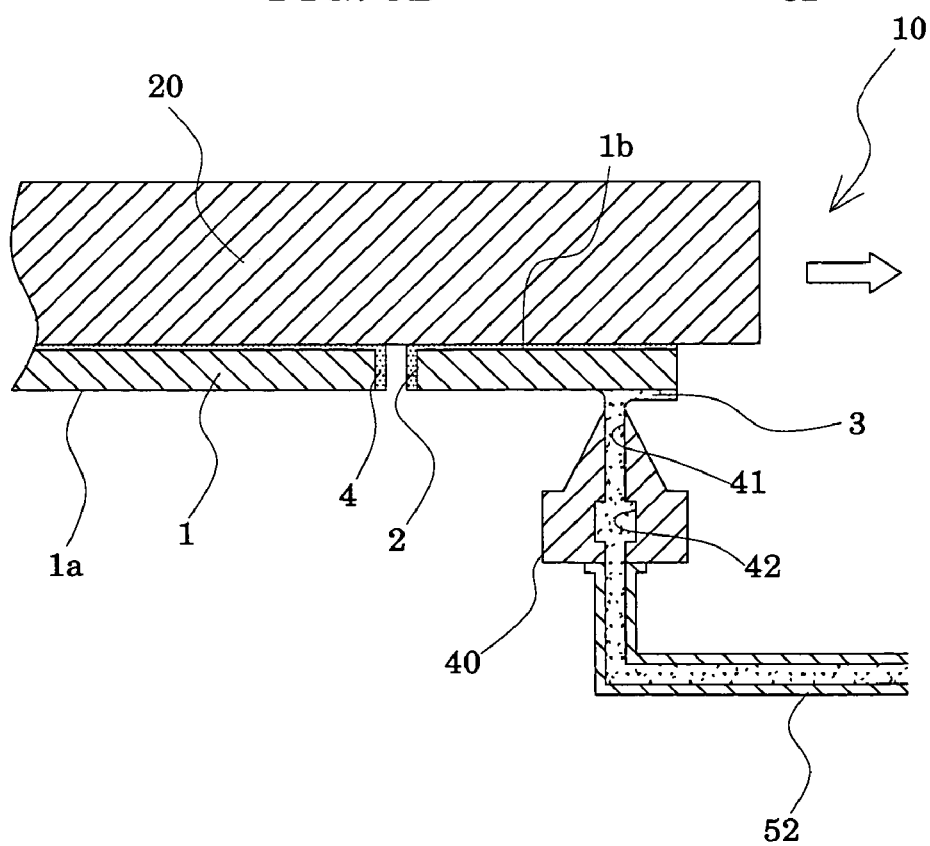
Figure 4:
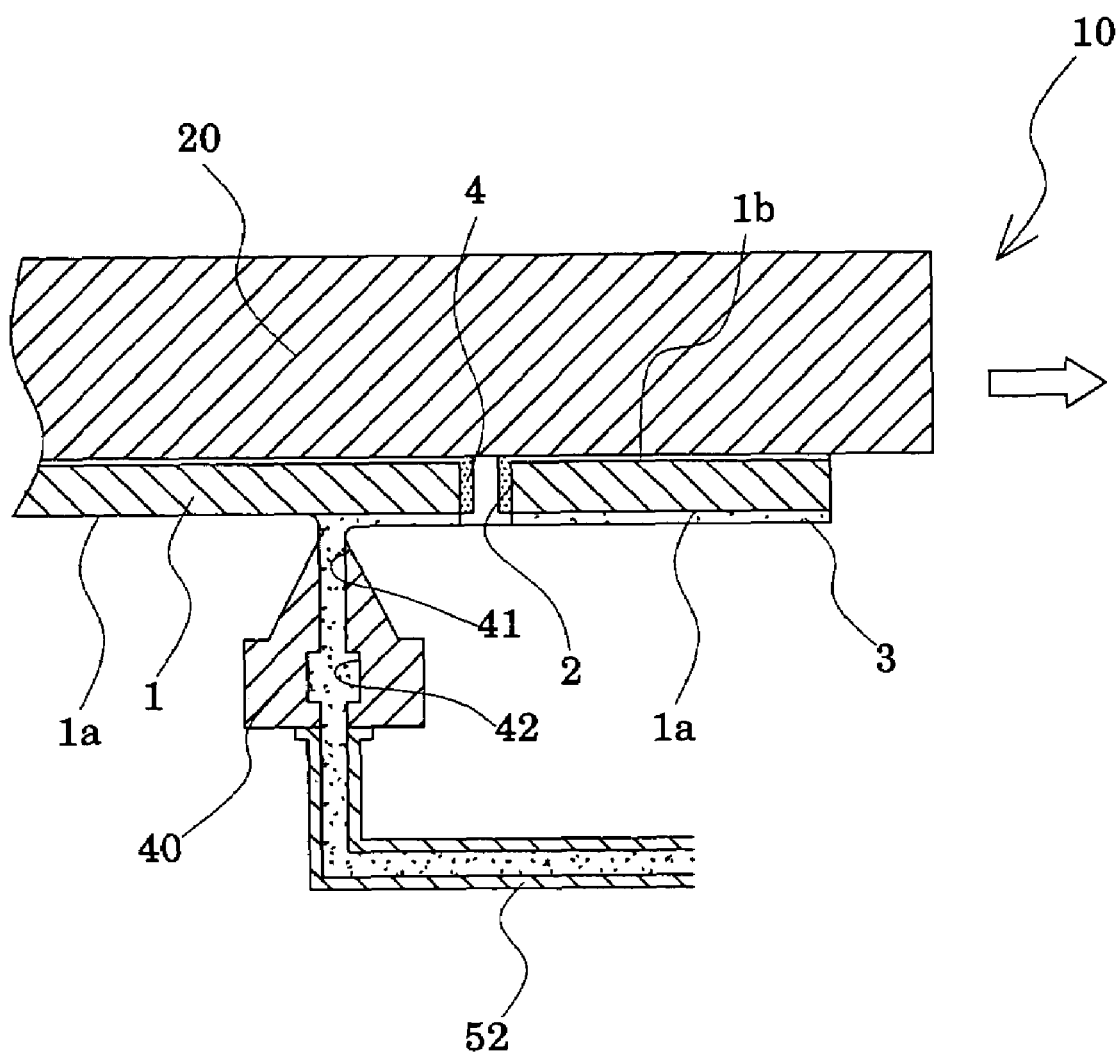
FIG. 4 is a cross-sectional view showing a film forming state of a plate according to the embodiment 1 of the present invention.

Next, as shown in FIG. 3B, the holding table 20 is moved in an in-plane direction of the coating surface 1a of the plate 1 by not-shown table driving means to start coating of the coating surface 1a with the coating solution 3. As shown in FIG. 4, since the inner surface of the through hole 2 is coated with the repellent solution 4, even if the holding table 20 continues to move and passes the through hole 2 of the plate 1, the coating solution 3 can be prevented from entering the through hole 2.

Thereafter, when the holding table 20 is moved and the entire coating surface 1a of the plate 1 is coated with the coating solution 3, the coating head 40 is separated from the plate 1, thus finishing the coating of the coating surface 1a of the plate 1 with the coating solution 3. In the aforementioned stand-by state after the coating is finished, the increase in viscosity of the coating solution 3 due to drying of the coating solution or mixing of foreign substances can be prevented by micro-vibration of the surface of the coating solution 3 in the vicinity of the nozzle orifice 41. In the stand-by state, the nozzle orifice 41 may be covered with a cap member or the like. Covering the nozzle orifice 41 with the cap member can surely prevent the coating solution 3 from drying or being mixed with foreign substances from the nozzle opening 41. When the coating is finished, the vicinity of the edge of the nozzle orifice 41 may be washed by, for example, irradiation of ultraviolet rays, plasma, or the like to prevent the degradation of the wettability of the coating solution 3 to the nozzle orifice 41.

As described above, the coating solution 3 is applied to the coating surface 1a of the plate 1 by the slit coater 10 in the state where the inner surface of the through hole 2 is coated with the repellent solution 4. Even in the case of the plate 1 having the through hole 2, the coating solution 3 can be therefore prevented from entering the through-hole 2, and only the coating surface 1a can be coated with a uniform thickness of the coating solution 3. In addition, the coating solution 3 can be prevented from spreading to the holding surface 1b side of the plate 1 through the through hole 2, thus eliminating the need for the step of removing the coating solution 3 from an unnecessary region including the inside of the through hole 2 and the holding surface 1b. Accordingly, the manufacturing process can be simplified, and the manufacturing cost can be reduced. Furthermore, the coating solution 3 can be prevented from spreading to the holding surface 1b of the plate 1, and the coating solution 3 does not adhere to the holding table 20, thus eliminating the need for the step of washing the holding table 20. Accordingly, the manufacturing process can be simplified, and the manufacturing cost can be reduced.

The coating apparatus 10 of this embodiment is provided with the injection head 101 as the coating preventing means, which applies the repellent solution 4 to the inside of the through hole 2 of the plate, in order to prevent the coating solution from entering the through hole 2 of the plate 1 when the coating solution 3 is applied to the plate 1 by the coating head 40.

Embodiment 2

In an embodiment 2, a description is given of a case where the coating method of the present invention is applied to formation of a repellent film and a resist film. The coating apparatus 10 of the embodiment 2 is a slit coater. The coating apparatus 10 includes heating means and an injection head as the coating preventing means. The heating means heats the plate 1. The injection head is the same as that of the aforementioned embodiment 1 and applies the repellent solution to the plate 1. With this coating preventing means, the repellent solution is applied to the inside of the through hole 2 of the plate 1 to form the repellent film, thus preventing the coating solution from entering the through hole 2 when the coating solution is applied to the plate.

1. Formation of Repellent Film

First, a description is given of formation of the repellent film.

FIGS. 5A to 5D are process views showing a film forming process of the repellent film of this embodiment.

In the present invention, to form a film on the plate 1 having through holes 2, the repellent solution is applied so that the film is not formed inside the through holes 2. Specifically, this embodiment includes a first application step applying the repellent solution for film formation to the holding surface 1b of the plate 1, which is opposite to the coating surface 1a, with a heating member for heating the plate 1 in contact with the coating surface 1a of the plate 1.

[First Application Step]

Figure 5A:
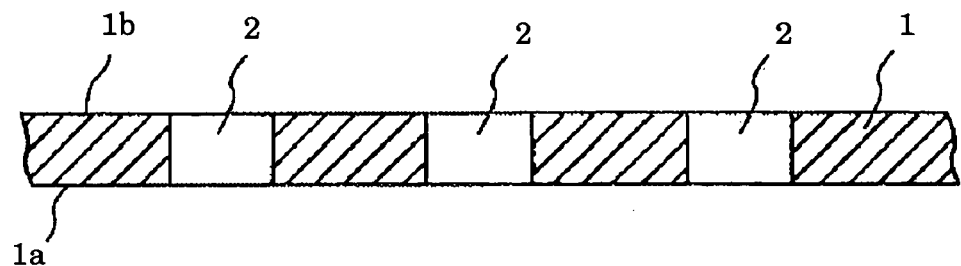
FIGS. 5A to 5D are perspective views schematically showing a construction of a coating apparatus according to an embodiment 2 of the present invention.

<1> First, as shown in FIG. 5A, the plate 1 with the through holes 2 is prepared. The plate 1 includes the coating surface 1a on which a film is formed and the holding surface 1b opposite to the coating surface 1a.

The material of the plate 1 is not particularly limited, and examples thereof are a semiconductor material such as silicon, an insulating material such as $SiO_2$ or $Al_2O_3$, and the like.

Preferably, the plate 1 has an average thickness of not less than 1 μm (more preferably, 10 to 1000 μm).

The shape of the through holes 2 is not particularly limited and, for example, may be a substantially cylindrical shape, a substantially rectangular shape, or the like. When the shape of the through holes 2 is substantially cylindrical, the average diameter of the through holes 2 is set to about 10 to 1000000 μm (more preferably, 100 to 100000 μm).

Figure 5B:
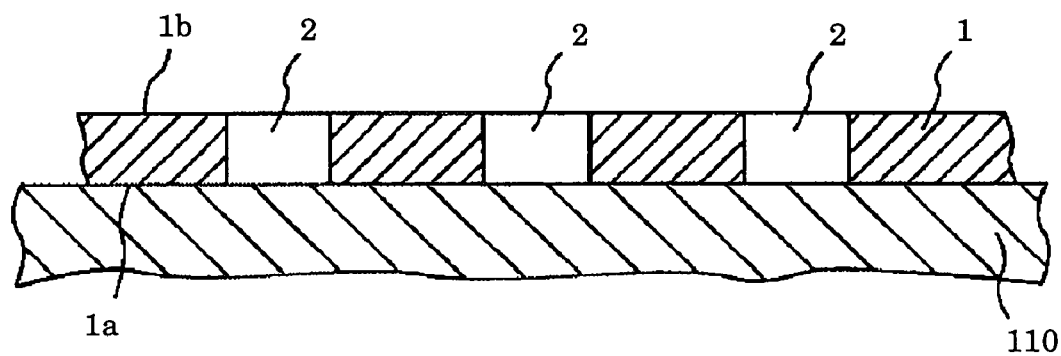

<2> Next, as shown in FIG. 5B, a heating member 110 for heating the plate 1 is brought into contact with the coating surface 1a of the plate 1. By bringing the heating member 110 into contact with the coating surface 1a in such a manner, the repellent solution which might spread to the coating surface 1a of the plate 1 through the through hole 2 when the repellent solution is applied to the holding surface 1b can be solidified before spreading. Consequently, the repellent solution can be surely prevented from spreading to the coating surface 1a. In addition, when the plate 1 is heated by the heating member 110 brought into contact therewith, while the later-described repellent solution is applied repellency, the repellent solution applied on the holding surface 1b can be dried. In other words, a series of steps from application to drying can be carried out as a single step.

Preferably, the surface of the heating member 110 to be brought into contact with the plate 1 is substantially planar. The plate 1 and heating member 110 can be thereby brought into close contact with each other. The close contact between the plate 1 and the heating member 110 can surely prevent the later-described repellent solution from spreading to the coating surface 1a.

Temperature of heating by the heating member 110 is preferably 40 to 500° C. and more preferably, 100 to 400° C., which can more surely prevent the later-described repellent solution from spreading to the coating surface 1a. On the contrary, when the heating temperature is too low, for example, in the case where the series of steps from application to drying is carried out as a single step, the drying takes a long time in some cases depending on the composition of the later-described repellent solution, the contact state between the plate 1 and the heating member 2, and the like. On the other hand, when the heating temperature is too high, for example, the repellent solution could change in quality due to heat in some cases, and a finally obtained film may not be able to sufficiently exert a desired function.

Figure 5C:
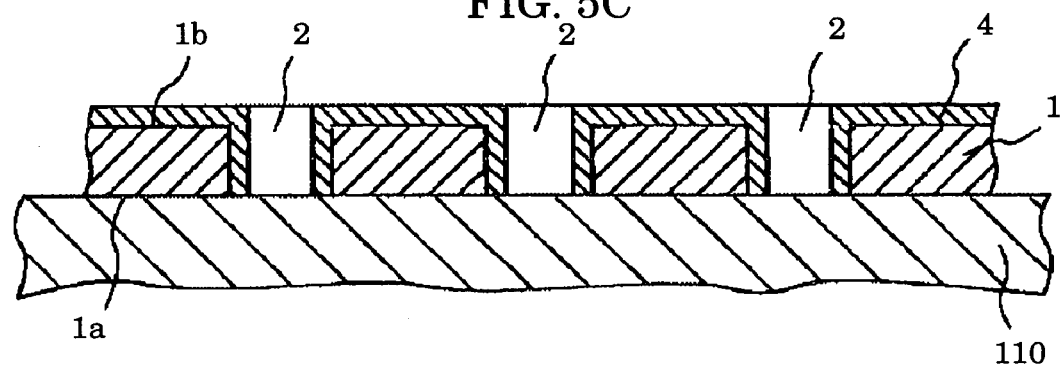
Figure 5D:
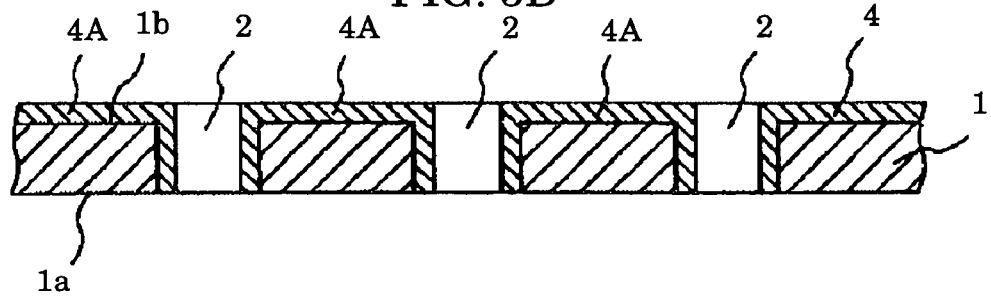

<3> Next, as shown in FIG. 5C, the repellent solution 4 for film formation is applied to the holding surface 1b of the plate 1 to form a repellent film 4A on the holding surface 1b.

The repellent solution 4 is also applied to the inside of the through hole 2. However, the applied repellent solution 4 does not spread to the coating surface 1a side while the repellent film 4A is formed also inside the through hole 2 since the plate 1 is in contact with the heating member 110 as described above.

In this embodiment, the repellent solution 4 is a material (repellent film forming material) for forming the repellent film 4A dispersed or dissolved in a solvent.

Examples of the repellent film forming material are various types of fluoroalkylsilane, fluoroalkanthiol, fluoroalkylalcohol, and precursors of the same. These materials can be used singly or in combination of two or more.

Examples of the solvent in which the aforementioned repellent film forming material is dispersed or dissolved are perfluorocarbon, perfluoroether, and the like.

The concentration of the repellent film forming material in the repellent solution 4 is, not particularly limited, preferably, 0.001 to 1 wt % and more preferably, 0.01 to 0.1 wt %. When the repellent film forming material has a concentration within such a range, it is possible to more reliably form a uniform repellent film. In addition, it is possible to form a comparatively thin film, and the drying can be efficiently performed.

As the method of applying the repellent solution 4 to the holding surface 1b, any method can be used. It is preferable that the repellent solution 4 be applied by spraying in the same manner as the aforementioned embodiment 1. Specifically, the coating apparatus 10 of this embodiment is provided with an injection head spraying the repellent solution 4 (not shown) With this injection head, the uniform repellent film 4A can be more surely formed on the plate 1.

The amount of repellent solution 4 applied to the holding surface 1b per unit area is preferably 0.0001 to 1 mL/cm$^2$ and more preferably, 0.0001 to 0.1 mL/cm$^2$. This enables the repellent film 4A with a proper thickness to be formed.

<4> Next, the film 4 (repellent solution 4) formed on the holding surface 1b of the plate 1 is dried (first drying step). The repellent film 4A is thus formed on the holding surface 1b of the plate 1 (see FIG. 5D). Generally, the drying is removal of the solvent, dispersion medium, or the like.

The method of drying the repellent solution 4 is not particularly limited, and examples thereof are $N_2$ blow, drying under reduced pressure, and methods of using an oven, a hot plate, and the like.

In this embodiment, the heating member 110 is in contact with the plate 1, and the film 4 is dried without a particular drying step. However, with the first drying step thus provided, the film 4 can be dried more surely for a shorter time to form the repellent film 4A.

The average thickness of the formed repellent film 4A is preferably 0.0001 to 10 μm and, more preferably, 0.0005 to 0.01 μm. This enables the function as the repellent film 4A to be suitably exerted. On the contrary, when the average thickness of the repellent film 4A is less than the above lower limit, the function as the repellent film 4A cannot be sufficiently exerted in some cases depending on the composition of the repellent film 4A and the like. On the other hand, when the average thickness of the repellent film 4A is more than the upper limit, the repellent film 4A could fill the through hole 2 depending on the size of the opening of the through hole 2.

To prevent the later-described coating solution from spreading, it is preferable that such a film (repellent film 4A) be excellent in repellency to the coating solution. Specifically, an angle of the later-described coating solution with respect to the film formed on the holding surface 1b (repellent film 4A) is preferably not less than 50 degrees and more preferably, not less than 90 degrees. This enables the coating solution to be prevented from spreading to the holding surface 1b side.

As described above, this film forming method of the present invention is characterized by applying the coating solution to the holding surface 1b of the plate 1 with the heating member 110 in contact with the coating surface of the plate 1. It is therefore possible to form a uniform film and sufficiently prevent the coating solution from spreading to the holding surface 1b side of the plate 1 through the through holes 2 when the coating solution is applied to the coating surface 1a. Specifically, as the coating preventing means to prevent the coating solution from entering the through holes 2, the coating apparatus 10 of this embodiment includes the heating member 110 and injection head for forming the repellent film 4A.

2. Formation of Resist Film

Next, the resist film is formed on the coating surface 1a, which is opposite to the holding surface 1b on which the repellent film 4A is formed.

FIGS. 6A to 6C and FIGS. 7A and 7B are cross sectional views of a main portion of the coating apparatus, showing the coating method of the resist film according to this embodiment. FIG. 8 is a cross sectional view showing the plate with the resist film formed thereon. In FIGS. 6A to 6C and FIGS. 7A and 7B, the through holes 2 and repellent film 4A are omitted for convenience of explanation.

[Second Application Step]

In a second application step, by the coating apparatus 10 composed of the slit coater, the coating solution 3 is applied on the holding surface 1b of the plate 1 on which the repellent film 4A is formed to form a resist film 3A (see FIG. 8). In this embodiment, the coating apparatus 10 composed of the slit coater is used. The film thickness can be therefore easily controlled, and the resist film 4A more uniform can be formed.

The coating apparatus 10 used in this embodiment, similar to the aforementioned embodiment 1, includes the coating head 40 having the nozzle orifice 41 discharging the coating solution 4 from the edge thereof and the reservoir means 50 supplying the coating solution 3 to the nozzle orifice 41.

In this embodiment, a description is given below of the case of using the resist material as the coating solution 3. The resist material applied to the film forming method of the present invention may be any of positive and negative resists.

21 1> First, the plate 1 with the repellent film 4A formed thereon is prepared.

Figure 6A:
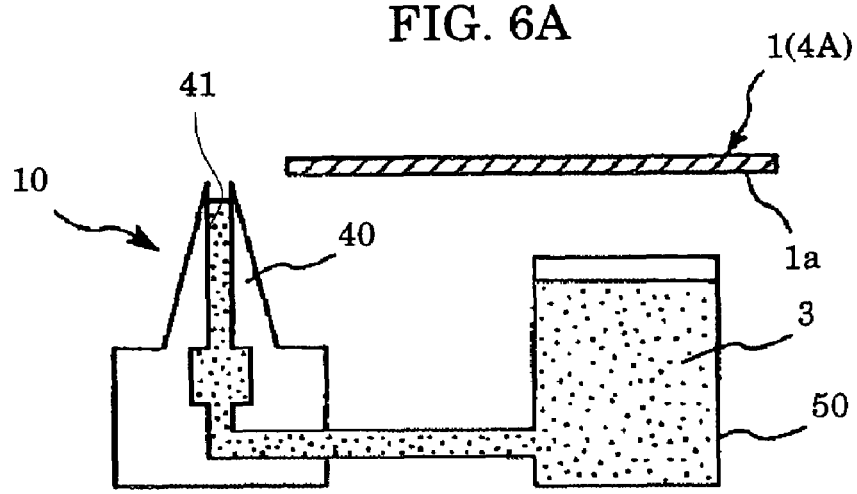
FIGS. 6A to 6C are cross sectional views of a main portion of the coating apparatus according to the embodiment 2 of the present invention.

<2> Next as shown in FIG. 6A, the plate 1 is set above the coating head 40 with the coating surface 1a directed to the nozzle orifice 41 side, that is, with the coating surface 1a of the plate 1 facing down. Directing the surface on which the resist film is formed downward in this manner can efficiently prevent the resist material 3 from spreading to the holding surface 1b side through the through hole 2 when the later-described coating solution (resist material) 3 is applied. If the resist material 3 enters the through hole 2, the resist material 3 is repelled within the through hole 2 and then returned to the coating surface 1a side due to the influence of gravity or the like. Consequently, the resist material 3 can be prevented from spreading to the holding surface 1b side.

Figure 6B:
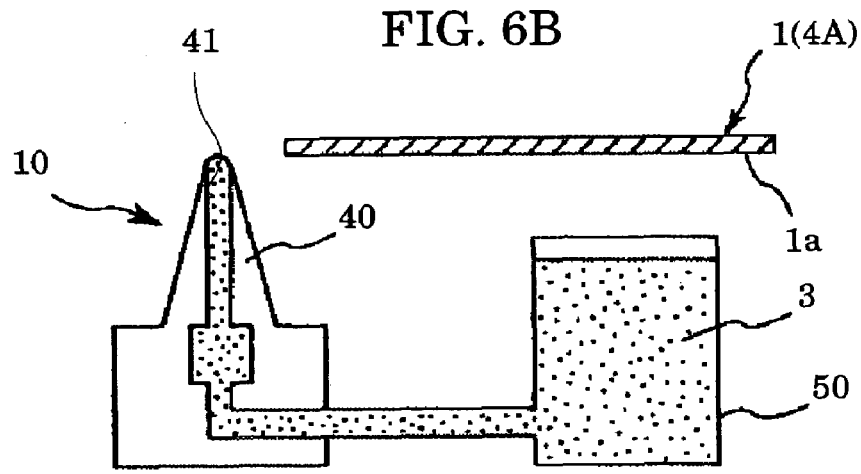

<3> Next, as shown in FIG. 6B, the resist material 3 is supplied to the nozzle orifice 41 from the reservoir means 50 such that the resist material 3 bulges at the edge of the nozzle orifice 41 of the coating head 40.

Figure 6C:
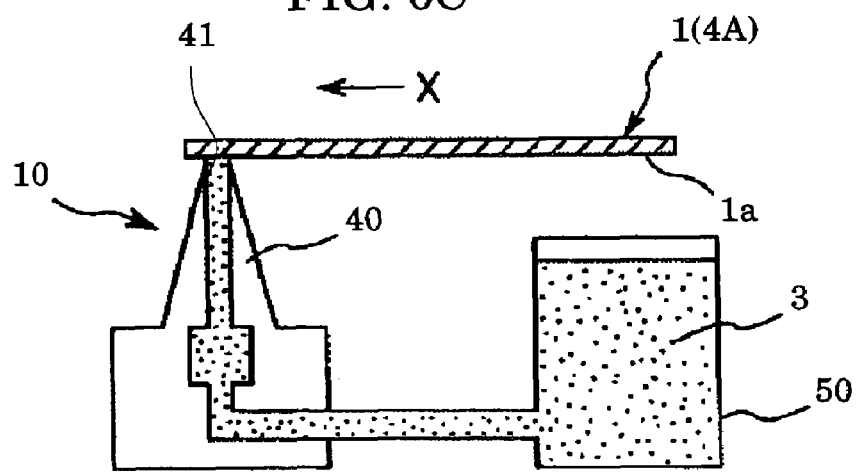

<4> Next, as shown in FIG. 6C, the plate 1 is moved to bring one end of the coating surface 1a of the plate 1 into contact with the resist material 3 bulging at the edge of the nozzle orifice 41.

Figure 7A:
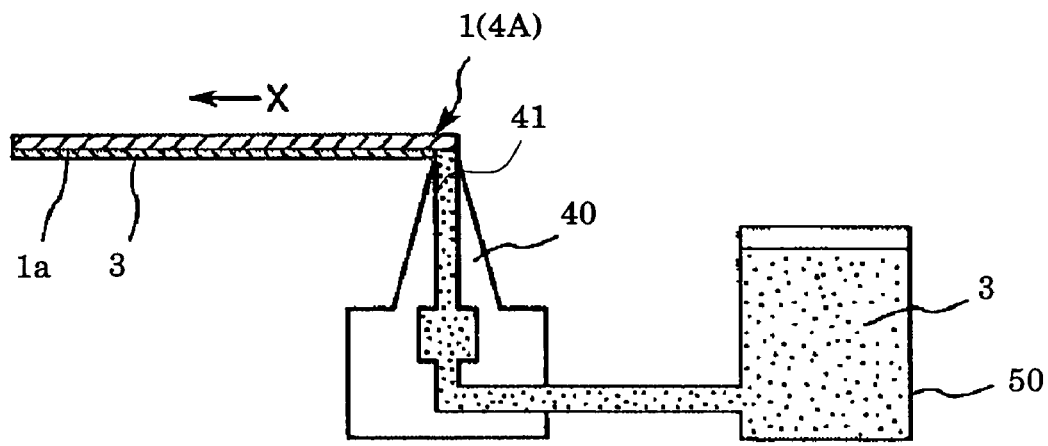
FIGS. 7A and 7B are cross sectional views of the main portion of the coating apparatus showing a coating method according to the embodiment 2 of the present invention.
Figure 7B:
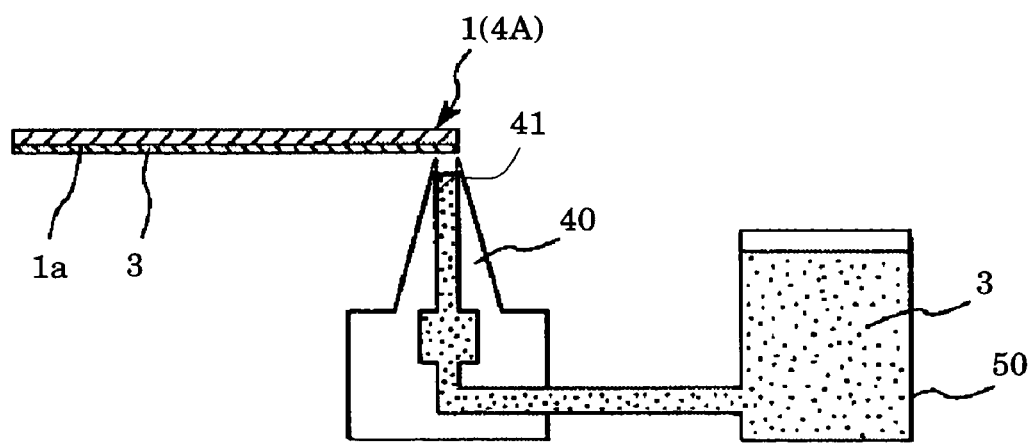
Figure 8:
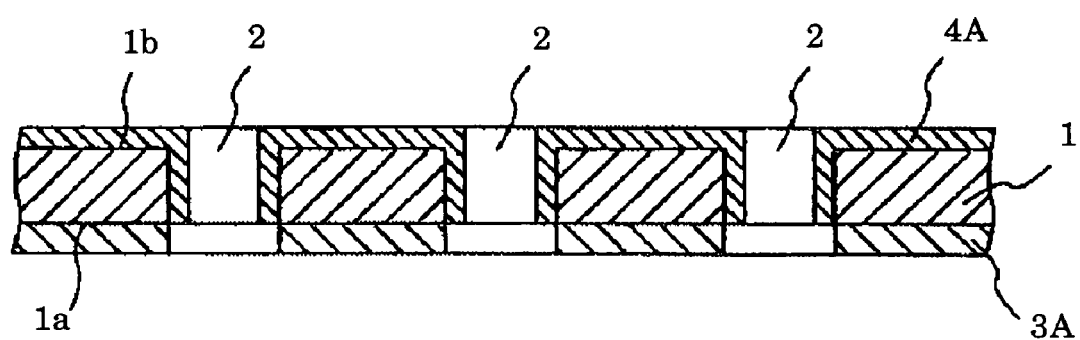
FIG. 8 is a cross sectional view showing a state of film formation of the plate according to the embodiment 2 of the present invention.

<5> Next, as shown in FIG. 7A, the plate 1 is moved in a direction X in the drawing, that is, in an in-plan direction of the coating surface 1a of the plate 1 in a state where the resist material 3 bulging at the edge of the nozzle orifice 41 is in contact with the coating surface 1a.

<6> Next, as shown in FIG. 7A, the supply of the resist material 3 from the reservoir means 50 is stopped, thus finishing a coating composed of the resist material 3.

In this embodiment, the repellent film 4A is formed on the surface opposite to the coating surface 1a, on which the resist film 3A is formed, that is, the holding surface 1b (including the insides of the through holes 2). Even if the resist material 3 enters the through hole 2, the resist material 3 is therefore repelled within the through hole 2 and then returned to the coating surface 1a side due to the influence of gravity or the like. Consequently, the resist material 3 can be prevented from spreading to the holding surface 1b side. In particular, even if the a large amount of the resist material 3 is applied and spreads to the holding surface 1b side, the resist material 3 is repelled by the repellent film 4A, and the resist film 3A can be selectively formed on the coating surface 1a.

<7> Subsequently, the coating composed of the resist material 3 is dried (second drying step). The resist film 3A shown in FIG. 8 is thus formed.

The method of drying the coating composed of the resist material 3 can be the method similar to the aforementioned method of drying the film 3.

The average thickness of the resist film 3A formed is preferably 0.2 to 15 µm, and more preferably, 0.3 to 15 µm. This enables the function as the resist film to be suitably exerted.

As described above, the coating apparatus 10 includes the coating preventing means composed of the heating member 110 heating the plate 1 and the injection head (not shown) applying the repellent solution 4 to the holding surface 1b. With this coating apparatus 10, the coating solution 3 is applied on the coating surface 1a after the repellent film 4A is formed on the holding surface 1b of the plate 1 and within the through hole 2. The coating solution 3 can be therefore prevented from entering the through holes 2 of the plate 1, and only the coating surface 1a is coated with the coating solution 3.

In the aforementioned embodiment, the case of forming the resist film 3A after forming the repellent film 4A has been described. However, the resist film need not be formed, and a film other than the resist film may be formed.

Moreover, in the aforementioned embodiment, the description has been given of the case of carrying out the drying step after each application step, but the drying steps can be omitted.

Embodiment 3

Figure 9:
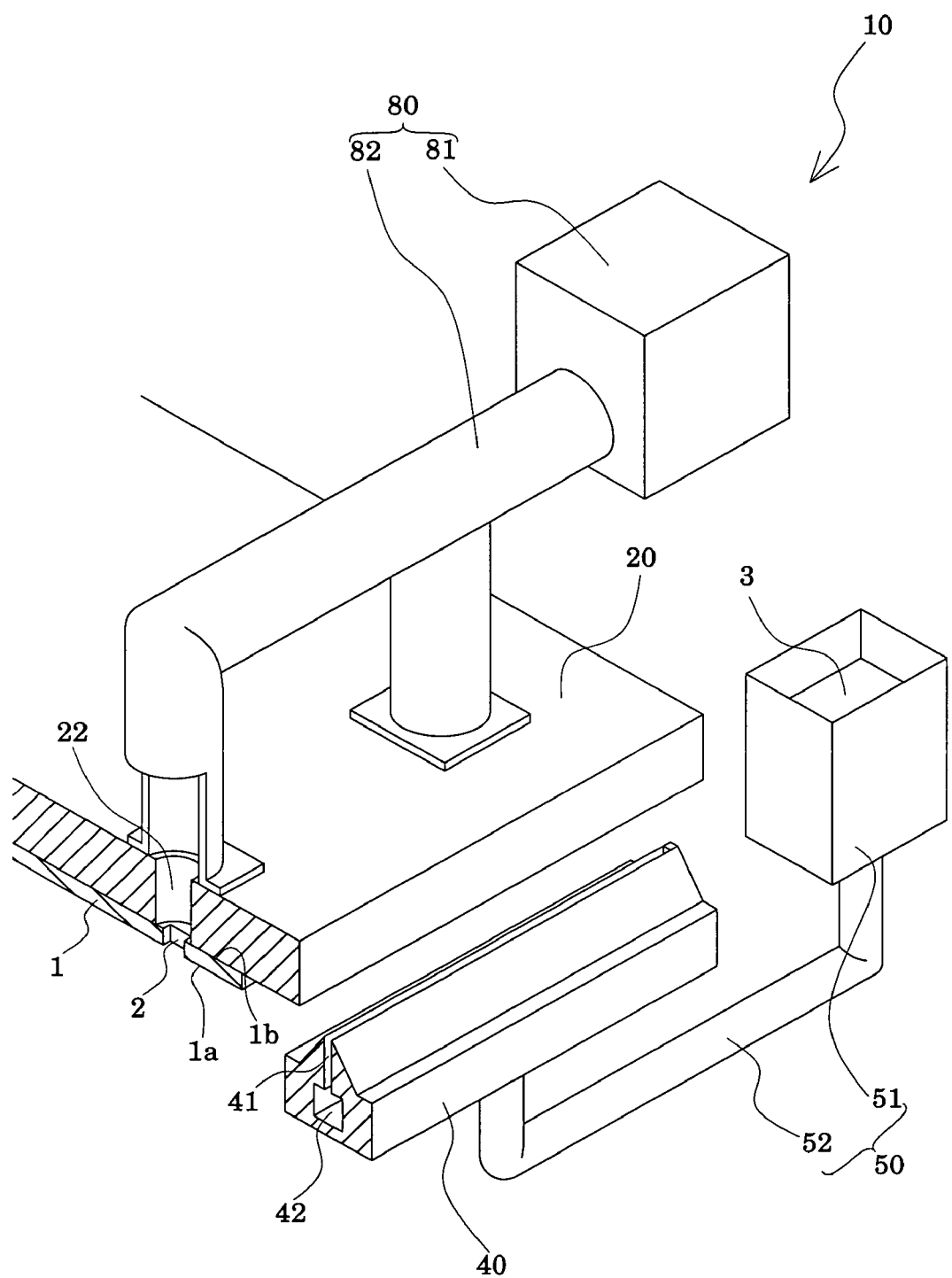
FIG. 9 is a perspective view schematically showing a construction of a coating apparatus according to an embodiment 3 of the present invention.
Figure 10:
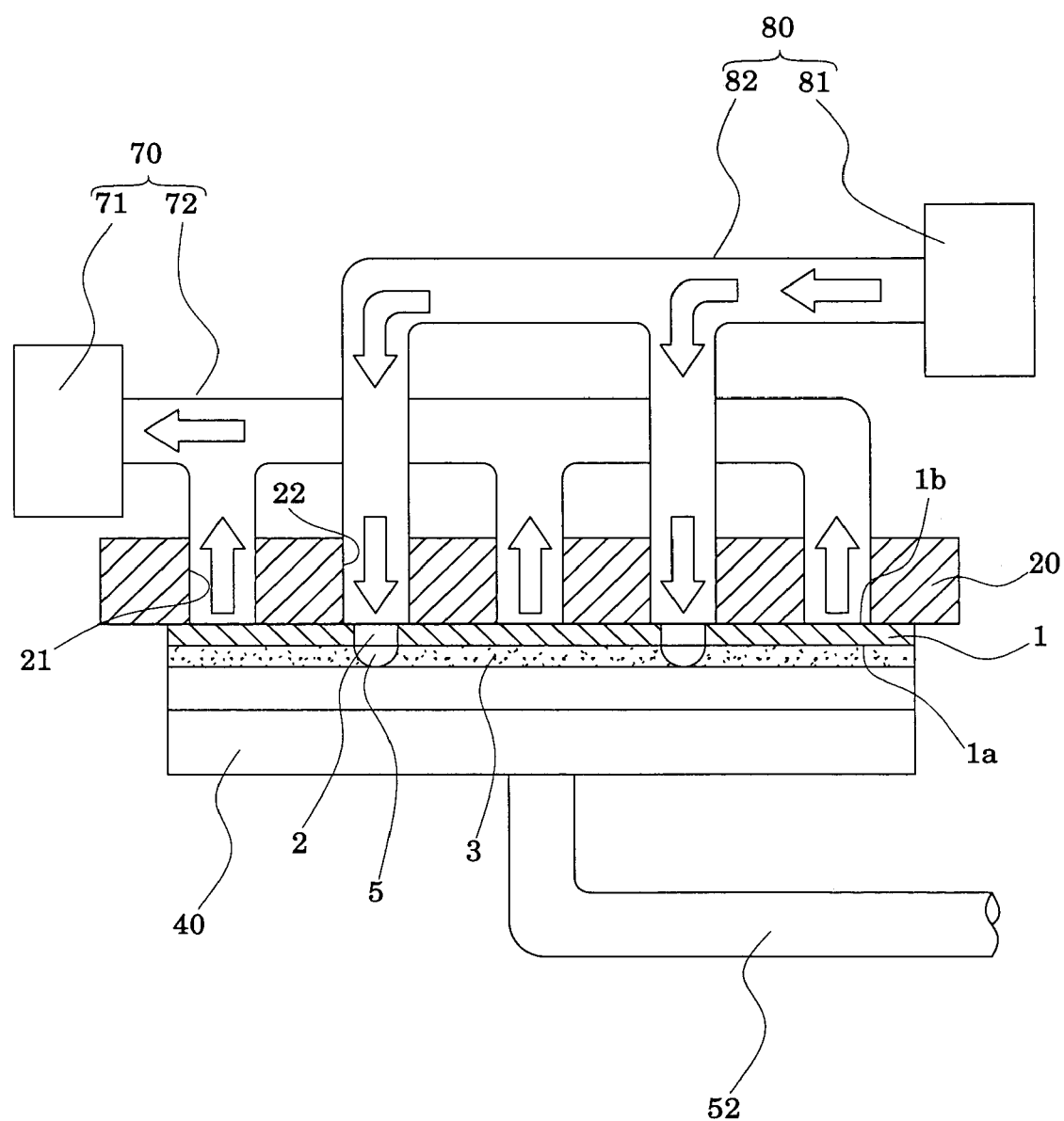
FIG. 10 is a cross sectional view of a main portion of the coating apparatus according to the embodiment 3 of the present invention.

FIG. 9 is a perspective view schematically showing a coating apparatus according to an embodiment 3 of the present invention. FIG. 10 is a cross-sectional view of a main portion of the coating apparatus. As shown in FIG. 9, the coating apparatus 10 of this embodiment is a slit coater. The coating apparatus 10 includes the-holding table 20 on which the plate 1 with the through hole 2 penetrating in the thickness direction is held, the coating head 40 provided on the plate 1 side of the holding table 20, and the reservoir means 50 supplying the coating solution 3 to the coating head 40.

As shown in FIGS. 9 and 10, the holding table 20 includes blower holes 22 penetrating in the thickness direction in regions corresponding to the through holes 2 of the plate 1. To the surface of the holding table 20 facing the surface on which the plate 1 is held, blowing means 80 is connected so as to communicate with the blower hole 22. This blowing means 80 includes a blower pump 81 such as an air pump and a blower pipe 82. One end of the blower pipe 82 is connected to the blower pump 81, and the other end thereof is connected to the blower holes 22 of the holding table 20 so as to communicate therewith. This blowing means 80 blows gas into the through holes 2 through the blower holes 22 from the holding surface 1b side of the through holes 2 of the plate 1 to the coating surface 1a side. In this coating apparatus 10 of the embodiment, as the coating preventing means for preventing the coating solution from entering the through holes 2 when the coating solution is applied to the coating surface 1a of the plate 1 by the coating head 40, the blower holes 22 and blowing means 80 are provided. Specifically, blowing gas into the through holes 2 from the holding surface 1b side toward the coating surface 1a side with the coating preventing means can prevent the coating solution from entering the through holes 2 when the coating solution is applied to the coating surface 1a by the coating head 40, which is described in detail later. The holding table 20 is freely moved in an in-plane direction of the coating surface 1a of the plate 1 by, for example, not-shown table driving means such as a driving motor.

On the coating surface 1a side of the plate 1 held on the holding table 20, the coating head 40 for applying the coating solution 3 to the coating surface 1a and the reservoir means 50 keeping the coating solution 3 to be supplied to the coating head 40.

Figure 11A:
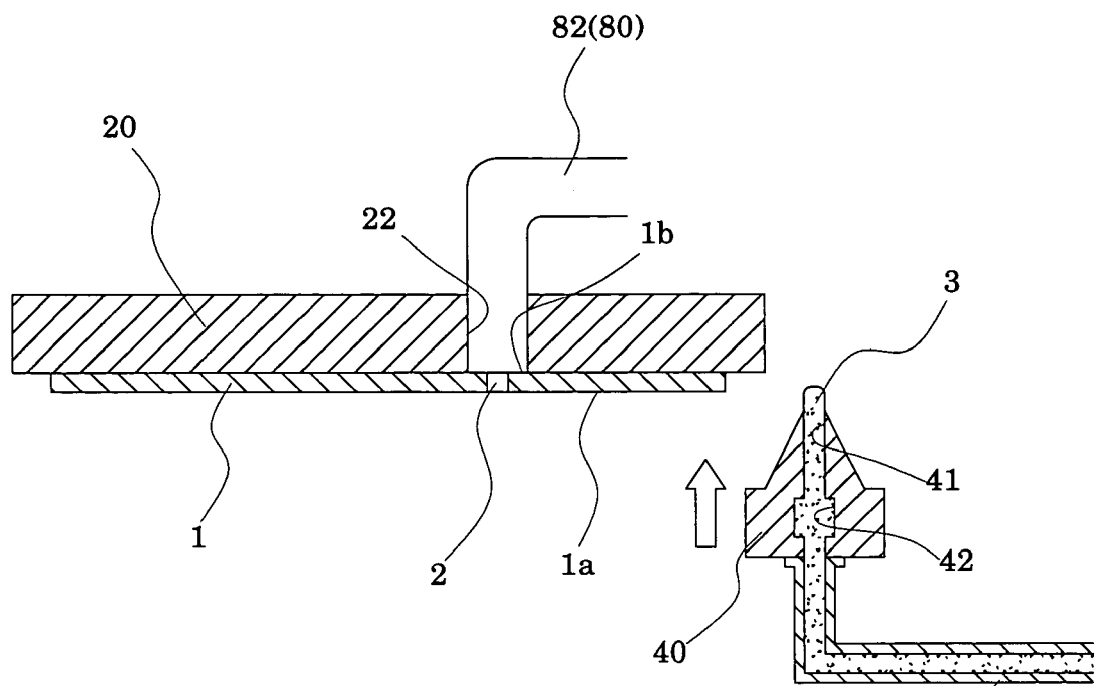
FIGS. 11A and 11B are cross sectional views of the main portion of the coating apparatus showing a coating method according to the embodiment 3 of the present invention.

Herein, a coating method using this coating apparatus 10 is described in detail. FIGS. 11A and 11B and FIGS. 12A and 12B are cross sectional views of a main portion of the coating apparatus, showing the coating method. As shown in FIG. 11A, the distance between the coating head 40 and the plate 1 is reduced to a predetermined distance with the coating solution 3 protruded from the edge of the nozzle orifice 41 of the coating head 40. In this embodiment, the distance between the coating head 40 and the plate 1 is adjusted by moving the coating head 40 toward the holding table 20.

Figure 11B:
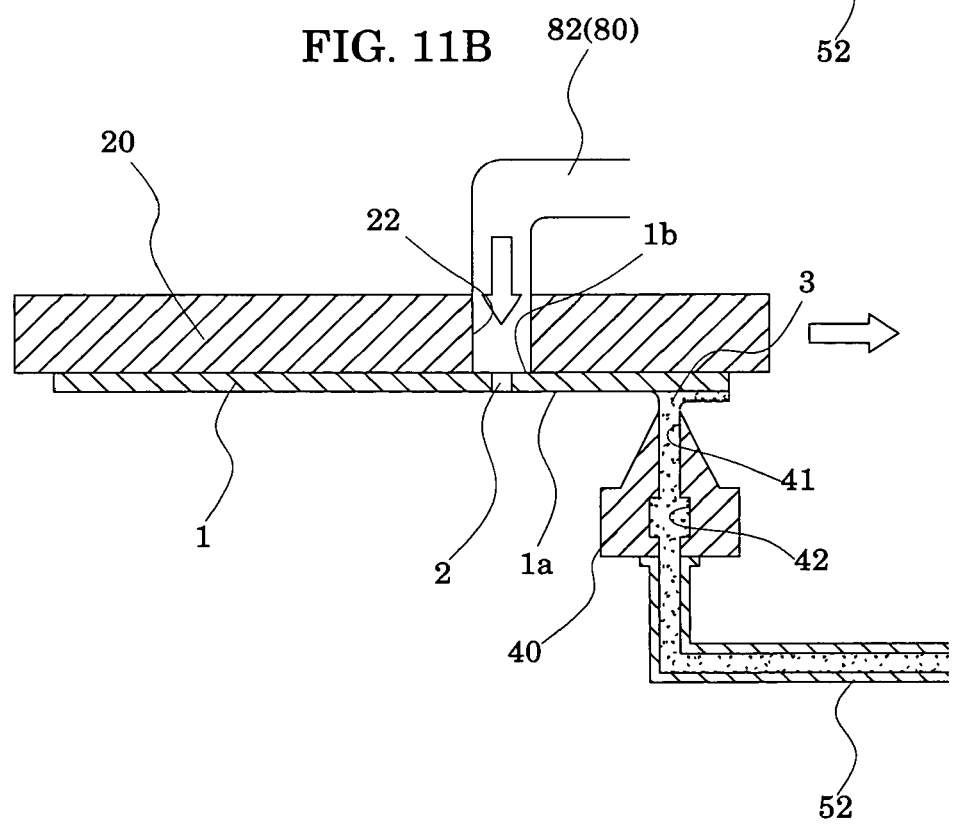
Figure 12A:
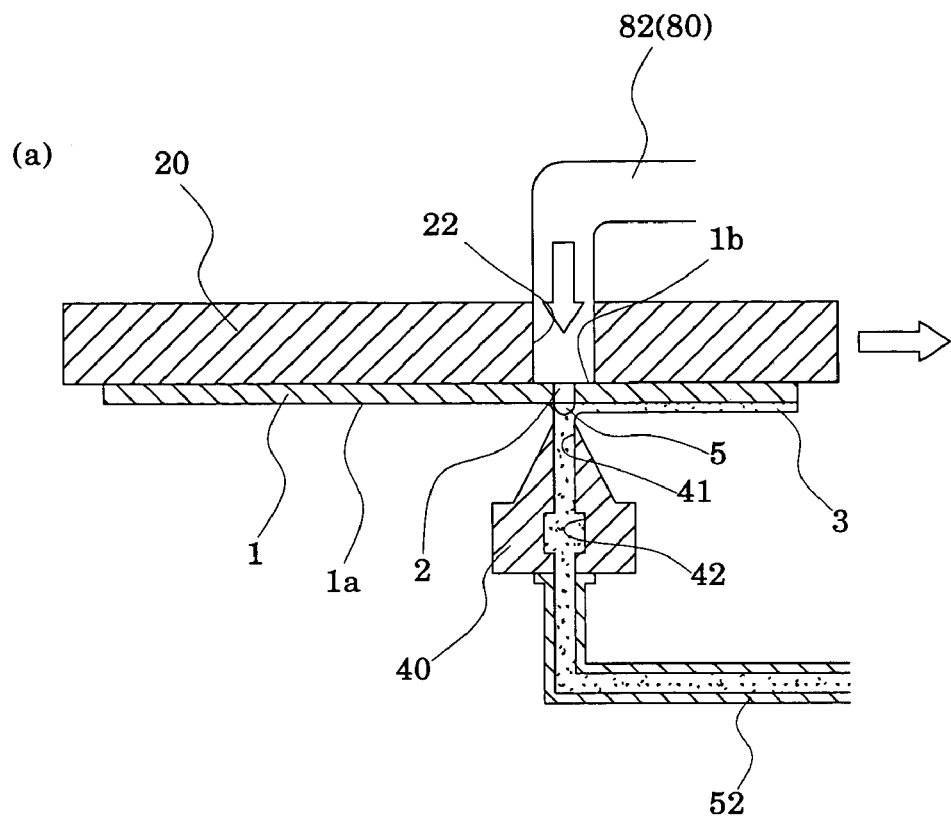
FIGS. 12A and 12B are cross sectional views of the main portion of the coating apparatus showing the coating method according to the embodiment 3 of the present invention.
Figure 12B:
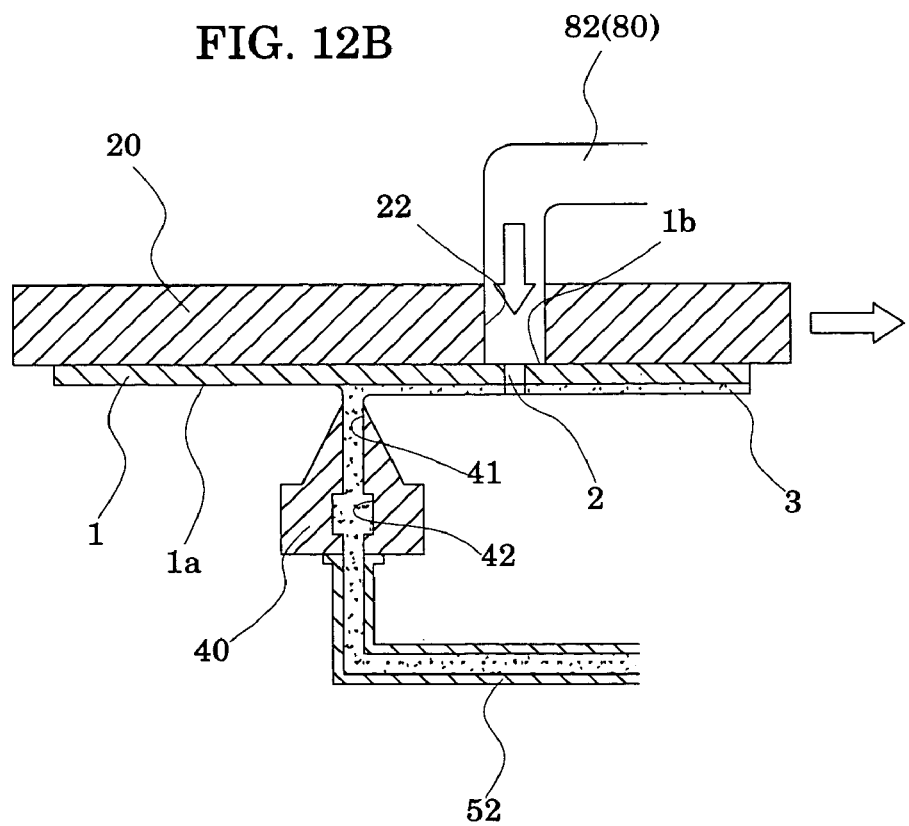

Next, as shown in FIG. 11B, the holding table 20 is moved in an in-plane direction of the coating surface 1a of the plate 1 by table driving means not shown to start coating the coating surface 1a with the coating solution 3. At the same time, gas is blown from the blowing means 80 to the through hole 2 from the holding surface 1b side toward the coating surface 1a side. The holding table 20 then continues to move. When the nozzle orifice 41 reaches the through hole 2 of the plate 1, since the gas is blown by the blowing means 80 into the through hole 2 from the holding surface 1b side toward the coating surface 1a side, as shown in FIGS. 12A and 10, the coating solution 3 flowing out from the edge of the nozzle orifice 41 is pushed away by the gas at a portion facing the through hole 2 to form a space 5. This space 5 can prevent the coating solution 3 from being applied to the inner surface of the through hole 2. When the holding table 20 is further moved, as shown in FIG. 12B, the coating solution 3 is applied so as to form an opening at the region corresponding to the through hole 2 of the plate 1. The applied coating solution 3 is prevented due to the surface tension thereof from flowing into the through hole 2 from the rim of the opening of the through hole 2. The region of the coating solution 3 applied to the plate 1 corresponding to the through hole 2 is maintained open. The blowing means 80 may continue to supply the gas until the coating solution 3 is applied to the entire coating surface 1a and then hardened. In addition, hardening means for hardening the coating solution 3 may be provided. The hardening means can be an electric heater, an ultraviolet lamp for ultraviolet irradiation, or the like depending on the type of the coating solution 3.

The pressure of the gas blown into the through hole 2 from the holding surface 1b side toward the coating surface 1a side is preferably set so that the space 5 is formed at a region of the applied coating solution 3 corresponding to the through hole 2 to have a size not less than the thickness of the applied coating solution 3 and that the coating solution 3 is opened at the region corresponding to the through hole 2. This is because when the pressure is small and the space 5 is formed to be smaller than the thickness of the applied coating solution 3, the space 5 is covered with the coating solution 3. When the gas blowing is stopped, the space 5 is pressed back by the coating solution 3, and the coating solution 3 could enter the through hole 2. On the contrary, when the pressure is too strong, the applied coating solution 3 ripples and cannot be uniformly applied to the coating surface 1a of the plate 1. The pressure of the gas blown from the through hole 2 should be therefore properly adjusted according to the viscosity of the coating solution 3, the wettability of the coating solution 3 to the plate 1, and the like.

The holding table 20 is moved, and the coating solution 3 is applied to the entire coating surface 1a. Thereafter, the coating head 40 is separated from the plate 1, thus finishing coating the coating surface 1a of the plate 1 with the coating solution 3.

As described above, even in the plate 1 with through hole 2, blowing the gas into the through holes 2 from the holding surface 1b side toward the coating surface 1a side can prevent the coating solution 3 from entering the through holes 2 and moreover prevent the coating solution 3 from spreading to the holding surface 1b side through the through holes 2. This eliminates the step of removing the coating solution 3 in region where it is unnecessary including the insides of the through holes 2 and the holding surface 1b. Accordingly, the manufacturing process can be simplified, and the manufacturing cost can be reduced. In addition, the coating solution 3 can be prevented from spreading to the holding surface 1b of the plate 1, and the coating solution 3 does not adhere to the holding table 20. This eliminates the step of washing the holding table 20. Accordingly, the manufacturing process can be simplified, and the manufacturing cost can be reduced.

In this embodiment, the blowing means 80 as the coating preventing means includes the blower pipe 82 and the blower pump 81, and the holding table 20 is provided with the blower holes 22 connected to the blower pipe 82. The blower means is not particularly limited to this and for example, may include a fan and driving means rotating the fan, such as a driving motor, provided on the side of the holding table's surface on which the plate 1 is held.

In this embodiment, the blower pump 81 constituting the blowing means 80 and the suction pump 71 constituting the suction means 70 are provided. However, the present invention is not limited to this, and a single pump for blowing and suction may be provided.

Embodiment 4

Figure 13:
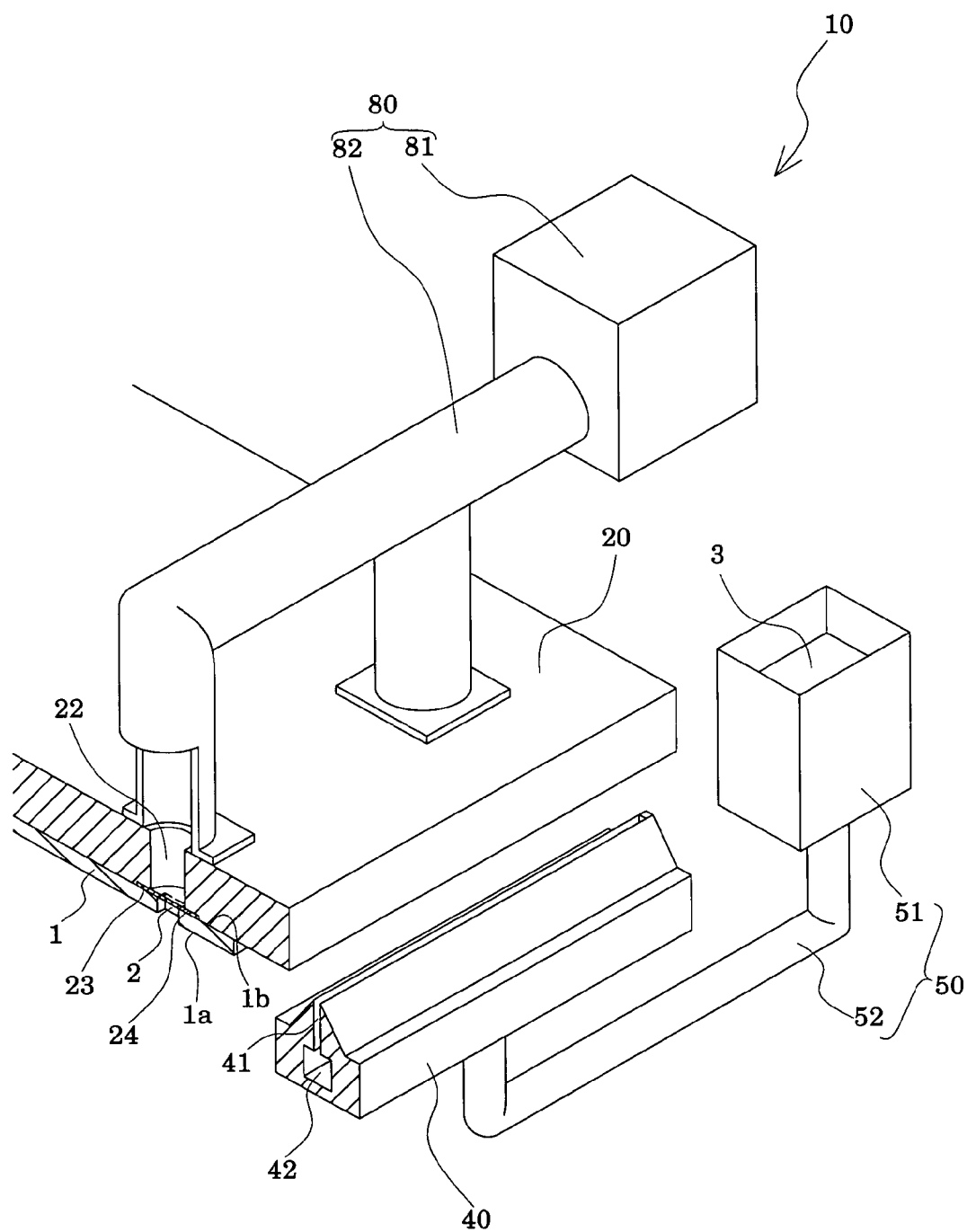
FIG. 13 is a cross sectional view of the main portion of the coating apparatus showing the coating method according to the embodiment 3 of the present invention.
Figure 14:
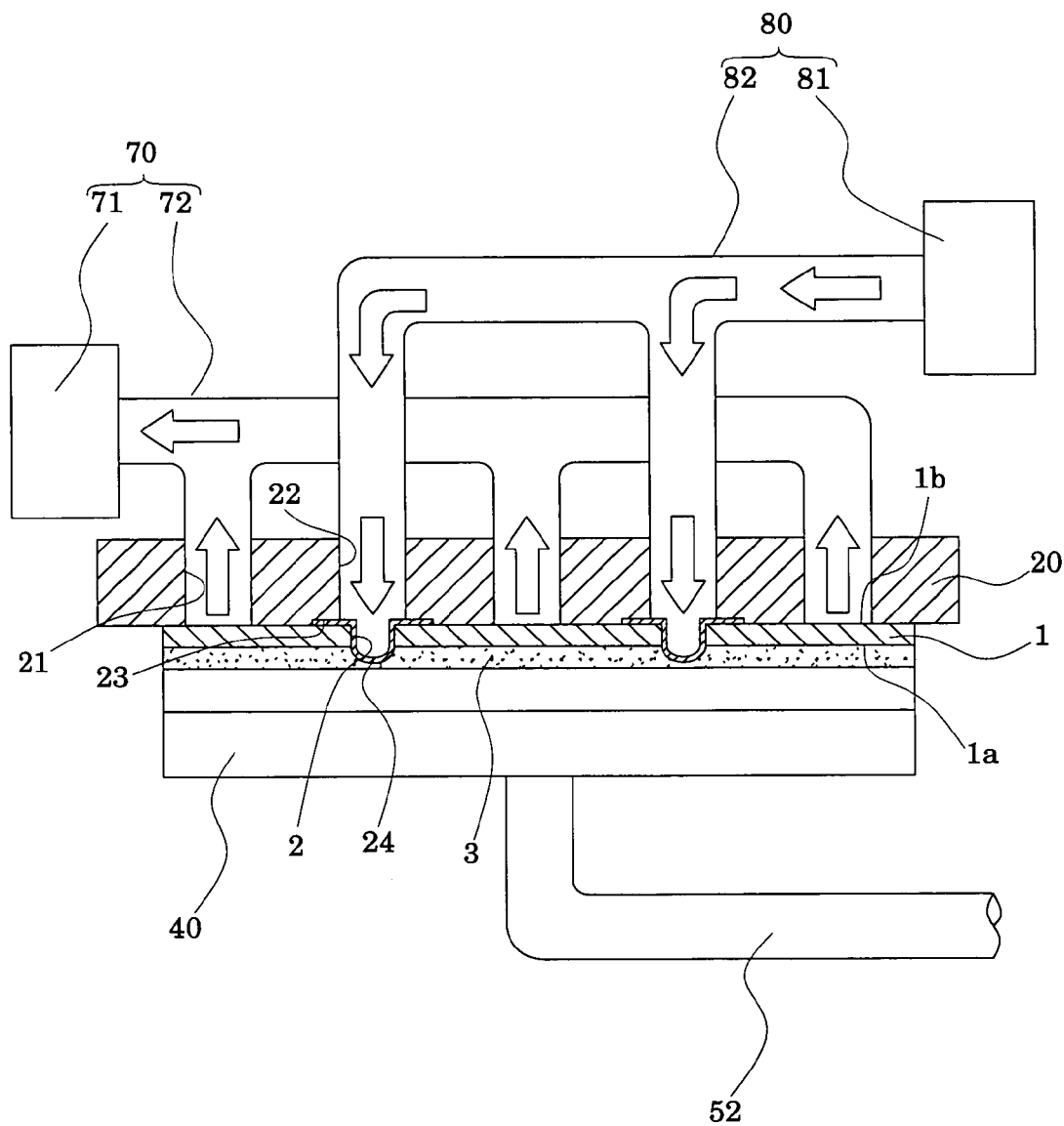
FIG. 14 is a perspective view schematically showing a construction of the coating apparatus according to an embodiment 4 of the present invention.

FIG. 13 is a perspective view schematically showing a construction of a coating apparatus according to an embodiment 4 of the present invention. FIG. 14 is a cross sectional view of a main portion of the coating apparatus. As shown in FIG. 13, the coating apparatus 10 of this embodiment is a slit coater. The coating apparatus 10 includes the holding table 20 on which the plate 1 with the through holes 2 penetrating in the thickness direction is held, the coating head 40 provided on the plate 1 side of the holding table 20, and the reservoir means 50 supplying the coating solution 3 to the coating head 40.

The holding table 20, as shown in FIG. 13 and 14, includes blower holes 22 penetrating in the thickness direction at regions facing through holes 2 of the plate 1. On the side of the surface of the holding table 20 on which the plate 1 is held, recess portions 23 are provided at regions where the blower holes 22 are opened. In the recess portions 23, elastic films 24 are provided so as to cover the openings of the blower holes 22. Each of the elastic films 24 is made of a rubber or elastomer material or the like which is elastically deformed into a bag shape. Each of the recess portions 23 provided with such elastic film 24 is formed to have a depth equal to the thickness of the elastic film 24. When the plate 1 is sucked and held on the holding table 20, therefore, any gap due to the elastic film 24 is not formed between the holding table 20 and the plate 1, and the plate 1 can be steadily sucked and held.

To the surface of the holding table 20 opposite to the surface on which the plate 1 is held, the blowing means 80, which is similar to that of the aforementioned embodiment 3, is connected as a pressurization means so as to communicate with the blower holes 22. This blowing means 80 includes the blower pump 81 such as an air pump and the blower pipe 82. One end of the blower pipe 82 is connected to the blower pump 81, and the other end thereof is connected to the blower holes 22 of the holding table 20 so as to communicate therewith. Gas blown from the blowing means 80 deforms the elastic films 24 into bag shapes within the through holes 2 of the plate 1. At this time, as shown in FIG. 14, each elastic film 24 needs to be deformed by the blowing means 80 in a bag shape so as to cover the opening of the through hole 2 on the coating surface 1a side. This is because if there is a gap formed between the elastically deformed elastic films 24 and the rims of the openings of the through holes 2, the coating solution 3 is applied to this gap when the coating surface 1a of the plate 1 is coated with the coating solution 3. In other words, each elastic film 24 is not necessarily elastically deformed so as to fill the entire through hole 2 and should be elastically deformed in a bag shape so as to at least cover the opening of the through hole 2 on the coating surface 1a side. For example, a gap may be formed at the rim of the opening of the through hole 2 on the holding table 20 side by elastic deformation of the elastic film. It is preferable that at least a surface of the elastic film 24 on the coating surface 1a side have repellency to the coating solution 3 to prevent the elastic films 24 from being coated with the coating solution 3. This is because if the elastic films 24 are coated with the coating solution 3 when the elastically deformed elastic films 24 are restored and pulled out from the through holes 2, the coating solution 3 on the elastic films 24 enters the through holes 2. As for the elastic film 24, the elastic film 24 itself may be formed of a repellent material, or a repellent film may be formed on the coating surface 1a side of each elastic film 24. In this embodiment, on the coating surface 1a side of each elastic film 24, for example, a repellent film is formed by applying a repellent solution made of Optool DSX (Product Name: (DAIKIN INDUSTRIES, Ltd.). In other words, in the coating apparatus 10 of this embodiment, as the coating preventing means for preventing the coating solution from entering the through holes 2 when the coating solution is applied to the coating surface 1a of the plate 1 by the coating head 40, the blower holes 22, the recess portions 23, and the blowing means 80 as the pressurization means are provided.

On the other hand, on the coating surface 1a side of the plate 1 held on the holding table 20, the coating head 40 applying the coating solution 3 to the coating surface 1a and the reservoir means 50 keeping the coating solution 3, which is supplied to the coating head 40, are provided.

Figure 15A:
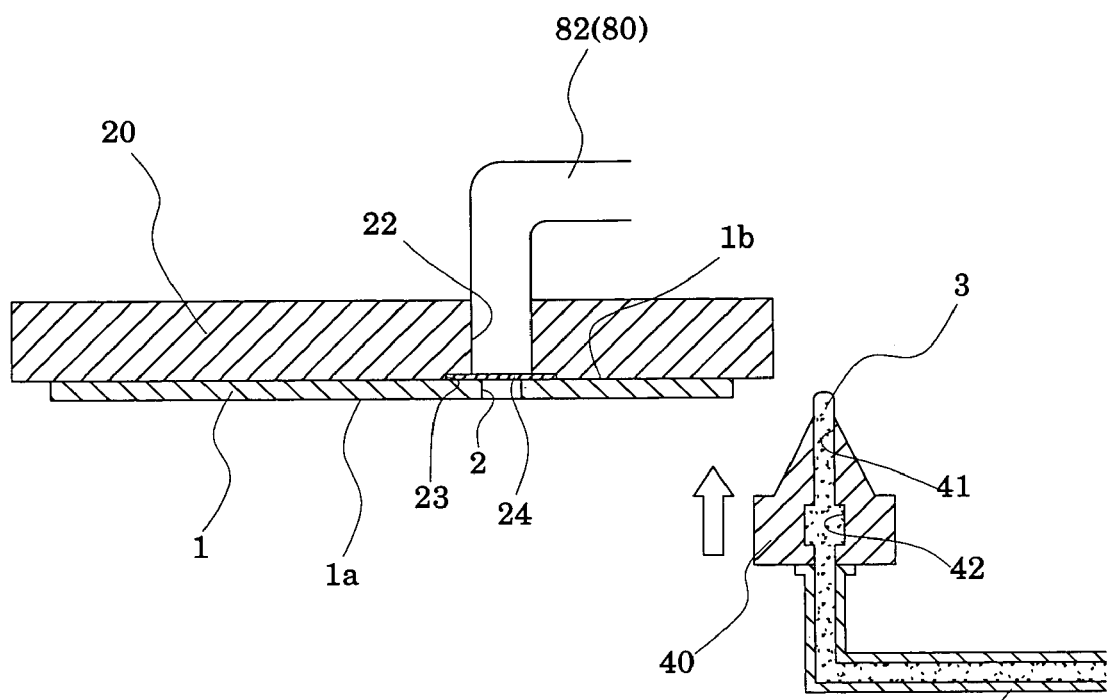
FIGS. 15A and 15B are cross sectional views of a main portion of the coating apparatus according to the embodiment 4 of the present invention.

Herein, a description is given in detail of a coating method using the coating apparatus 10 in this manner. FIGS. 15A and 15B, FIGS. 16A to 16B, and FIG. 17 are cross sectional views of a main portion of the coating apparatus, showing the coating method. As shown in FIG. 15A, the distance between the coating head 40 and the plate 1 is reduced to a predetermined distance with the coating solution 3 protruded from the edge of the nozzle orifice 41 of the coating head 40. In this embodiment, the distance between the coating head 40 and the plate 1 is adjusted by moving the coating head 40 toward the holding table 20.

Figure 15B:
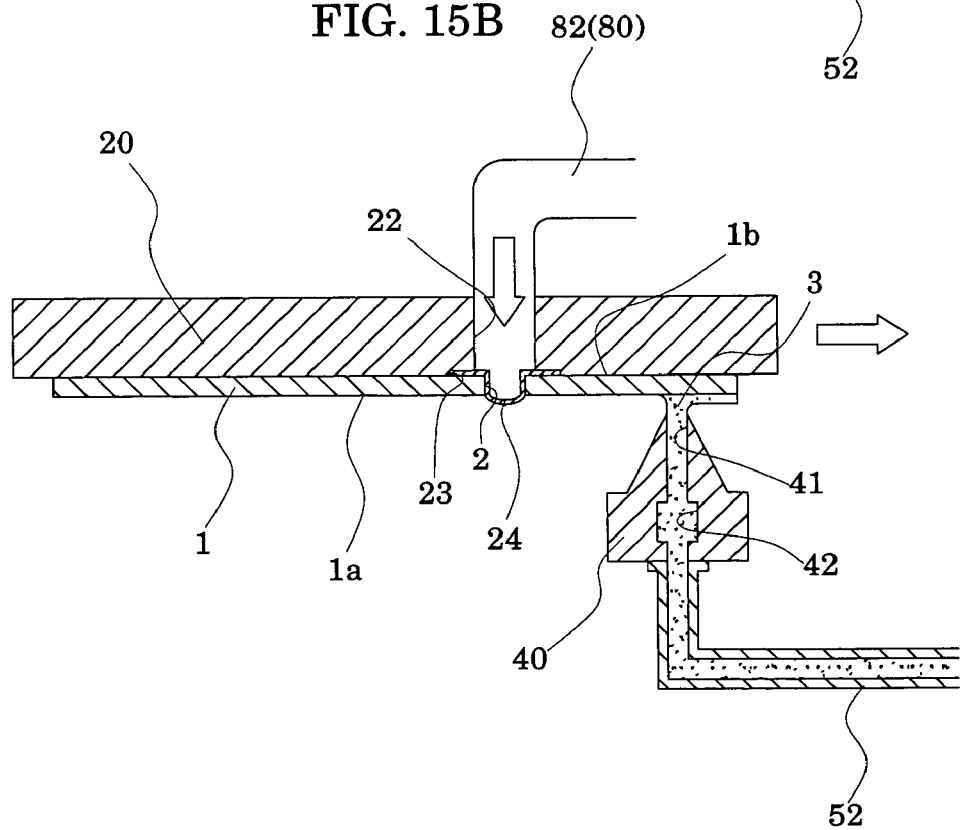
Figure 16A:
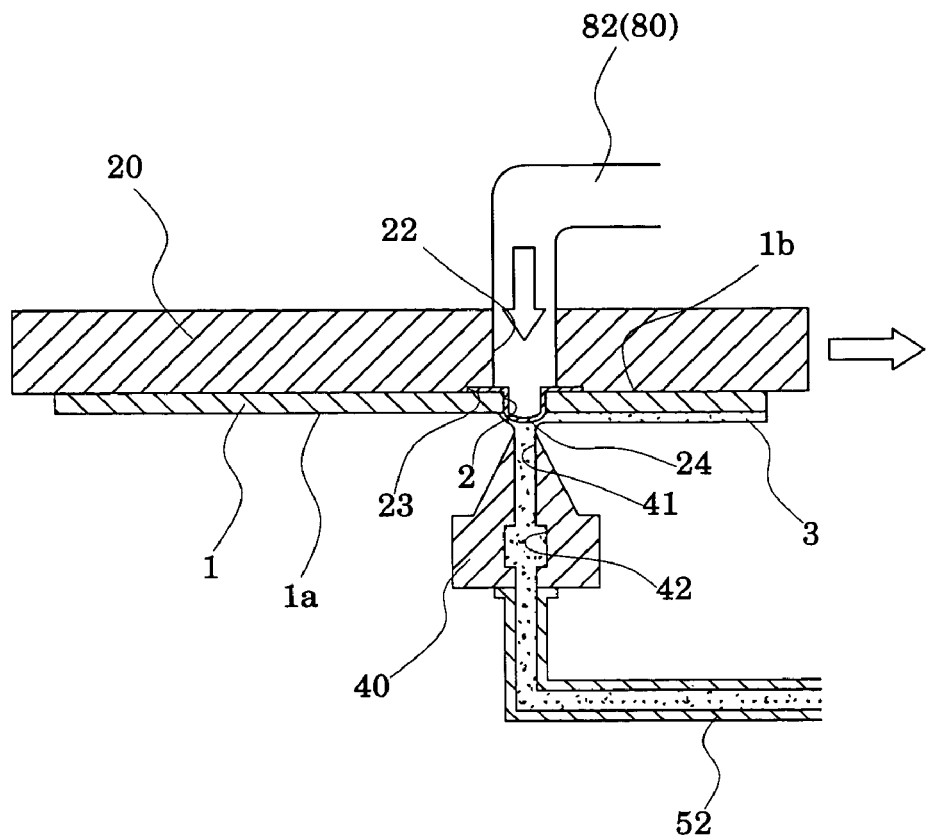
FIGS. 16A and 16B are cross sectional views of the main portion showing a coating method according to the embodiment 4 of the present invention.

Next, as shown in FIG. 15B, the holding table 20 is moved in an in-plane direction of the coating surface 1a of the plate 1 by a table driving means not shown to start coating the coating surface 1a with the coating solution 3. At the same time, gas is blown from the blowing means 80 to elastically deform the elastic films 24 in a bag shape within the through holes 2. As shown in FIGS. 16A and 14, the holding table 20 continues to move, and the nozzle orifice 41 reaches the through hole 2 of the plate 1. Herein, since the opening of the through hole 2 on the coating surface 1a side is blocked with the elastic film 24 elastically deformed in a bag shape, the coating solution 3 discharged from the edge of the nozzle orifice 41 can be prevented by the elastic film 24 from entering the through hole 2. If a gap is formed between the elastic film 24 elastically deformed in a bag shape and the rim of the opening of the through hole 2 on the coating surface 1a side at this time, the coating solution 3 is applied to this gap. If the coating solution 3 adheres to the gap in such a manner, the coating solution 3 gradually enters the through hole 2 starting from the coating solution 3 adhering to the gap and further spreads to the holding surface 1b side when the elastic deformation of the elastic film 24 stops. The elastic film 24 is therefore required to be elastically deformed in a bag shape so as to block the opening of the through hole 2 on the coating surface 1a side.

Figure 16B:
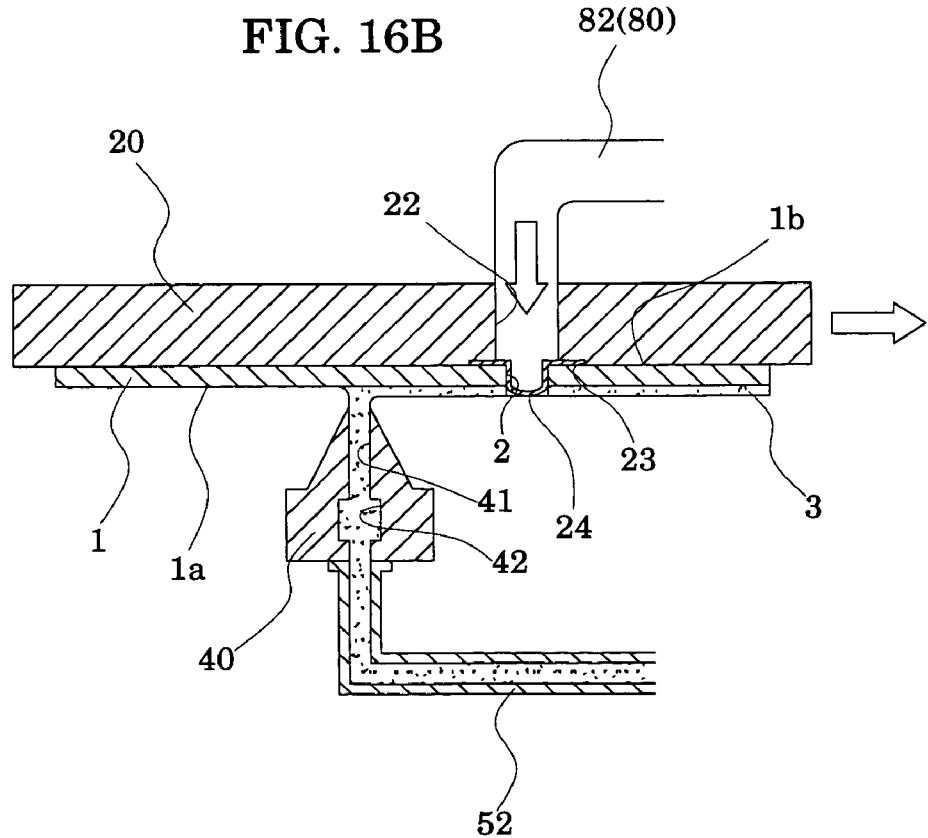
Figure 17:
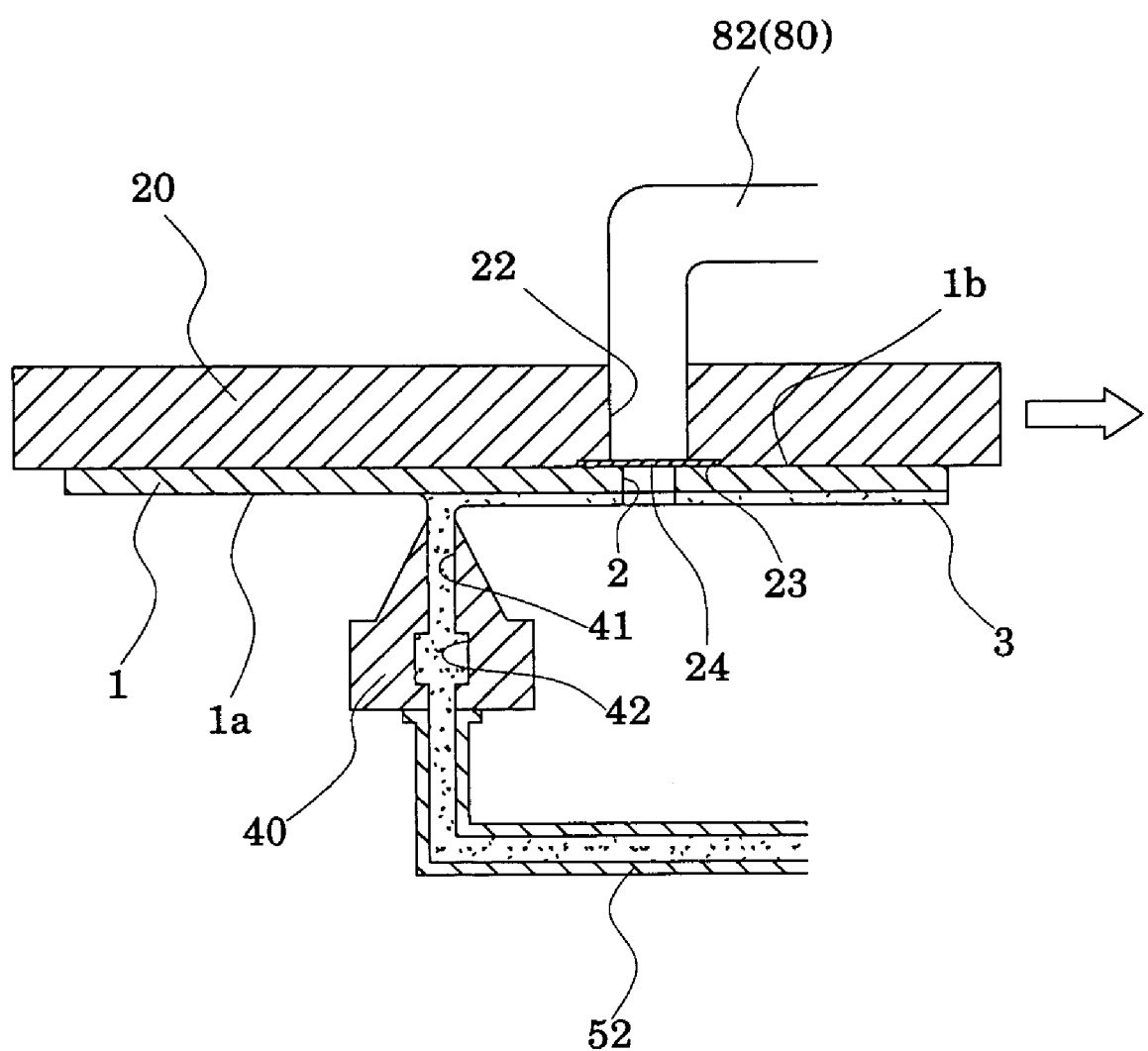
FIG. 17 is a cross sectional view of the main portion showing the coating method according to the embodiment 4 of the present invention.

As shown in FIG. 16B, after the holding table 20 is further moved and the coating head 40 passes the through hole 2, the coating solution 3 applied to the elastic film 24 does not remain on the elastic film 24 since the repellent film is formed on the surface of the elastic film 24 on the coating surface 1a side. Accordingly, an opening is formed in a region facing the elastic film 24 of the coating solution 3 applied to the coating surface 1a. As described above, when the through hole 2 passes the coating head 40, as shown in FIG. 17, the elastic deformation of the elastic film 24 by the blowing means 80 is stopped, and the elastic film 24 is drawn to the holding table 20 side. At this time, since the coating solution 3 is not applied on the elastic film 24, the inside of the through hole 2 is not coated with the coating solution 3. In addition, the applied coating solution 3 is prevented due to the surface tension thereof from flowing into the through hole 2 from the rim of the opening of the through hole 2, and the region of the coating solution 3 applied to the plate 1 which is corresponding to the through hole 2 is maintained open. The blowing means 80 may continue to blow the gas until the coating solution 3 is applied to the entire coating surface 1a and hardened. In addition, hardening means for hardening the coating solution 3 may be provided. The hardening means can be an electric heater, an ultraviolet lamp for ultraviolet irradiation, and the like depending on the type of the coating solution 3.

The holding table 20 is then moved, and the coating solution 3 is applied to the entire coating surface 1a of the plate 1. Thereafter, the coating head 40 is separated from the plate 1, thus finishing coating the coating surface 1a of the plate 1 with the coating solution 3.

As described above, even in the plate 1 with the through holes 2, elastically deforming the elastic films 24 in a bag shape within the through holes 2 so as to block the openings of the through holes 2 can prevent the applied coating solution 3 from entering the through holes 2 and prevent the coating solution 3 from spreading to the holding surface 1b side of the plate 1 through the through holes 2. This eliminates the need for the step of removing the coating solution 3 in regions where it is unnecessary including the insides of the through holes 2 and the holding surface 1b. Accordingly, the manufacturing process can be simplified, and the manufacturing cost can be reduced. In addition, the coating solution 3 can be prevented from spreading to the holding surface 1b of the plate 1, and the coating solution 3 does not adhere to the holding table 20, which eliminates the step of washing the holding table 20. Accordingly, the manufacturing process can be simplified, and the manufacturing cost can be reduced. Furthermore, since the blowing means 80 elastically deforms the elastic films 24 by blowing the gas, it is possible to use the holding table 20 with the same elastic films 24 for a plate with through holes different in inner diameter. This eliminates replacement of the holding table 20, the elastic films 24, and the like, thus reducing the manufacturing costs.

In this embodiment, the blower pump 81 constituting the blowing means 80 and the suction pump 71 constituting the suction means 70 are provided. However, the present invention is not particularly limited to this, and a single pump for blowing and suction may be provided. Moreover, as the pressurization means as the coating preventing means, the blowing means 80 composed of the blower pipe 82 and the blower pump 81 is provided. However, the pressurization means is not particularly limited to this if the elastic films 24 can be elastically deformed by pressurization means. For example, the pressurization means may be one that elastically deforms the elastic films 24 with a liquid such as water. Alternatively, the pressurization means may be one mechanically pressing the elastic films 24 with stick members.

In this embodiment, the recess portions 23 are provided in the regions of the holding table 20 corresponding to the through holes 2, and the elastic films 24 are provided within the respective recess portions 23. However, the present invention is not particularly limited to this, and for example, an elastic film may be provided on the entire surface of the holding table 20 on which the plate 1 is held and include openings communicating with the suction holes.

Embodiment 5

Figure 18:
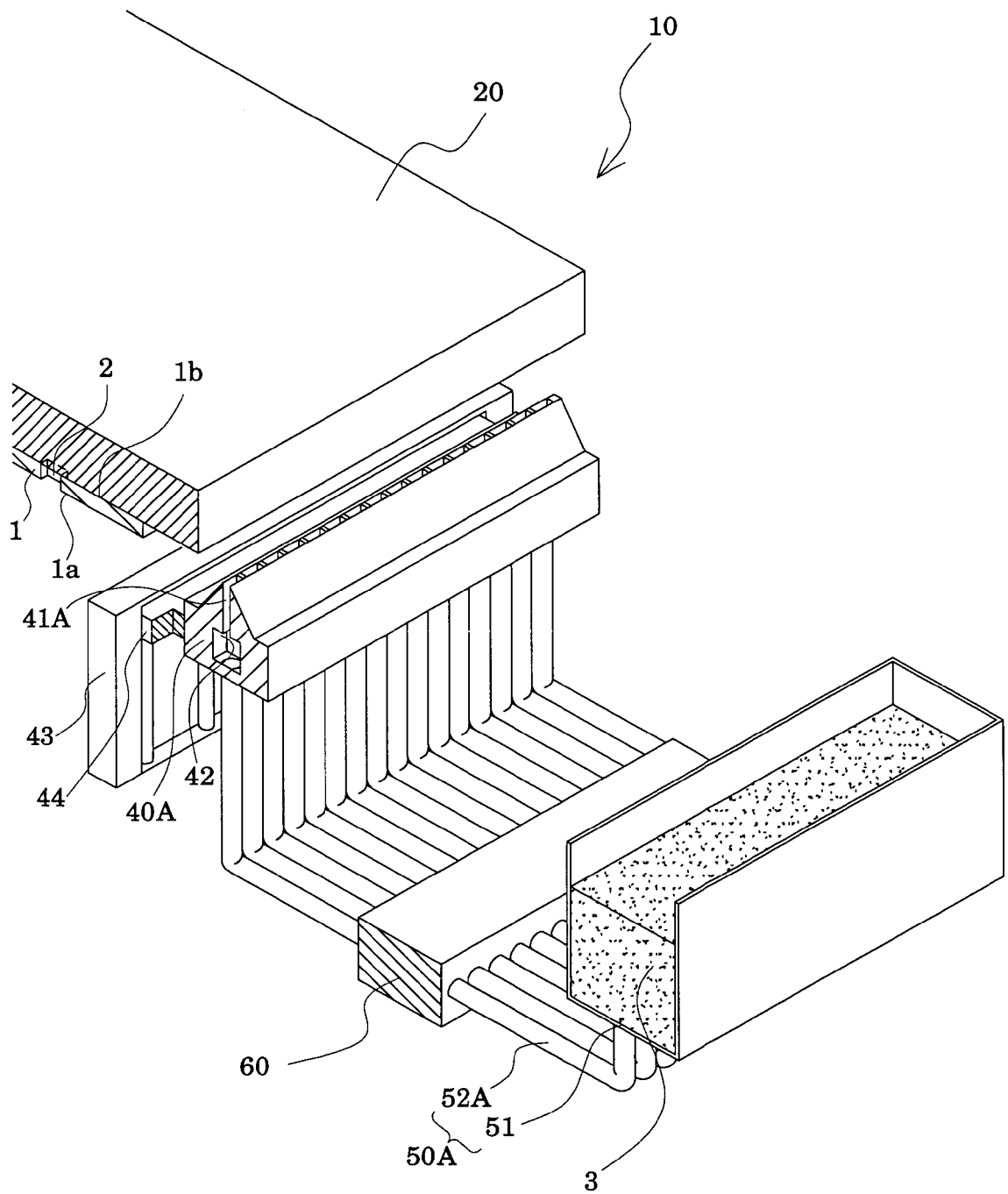
FIG. 18 is a cross sectional view of the main portion showing the coating method according to the embodiment 4 of the present invention.
Figure 19:
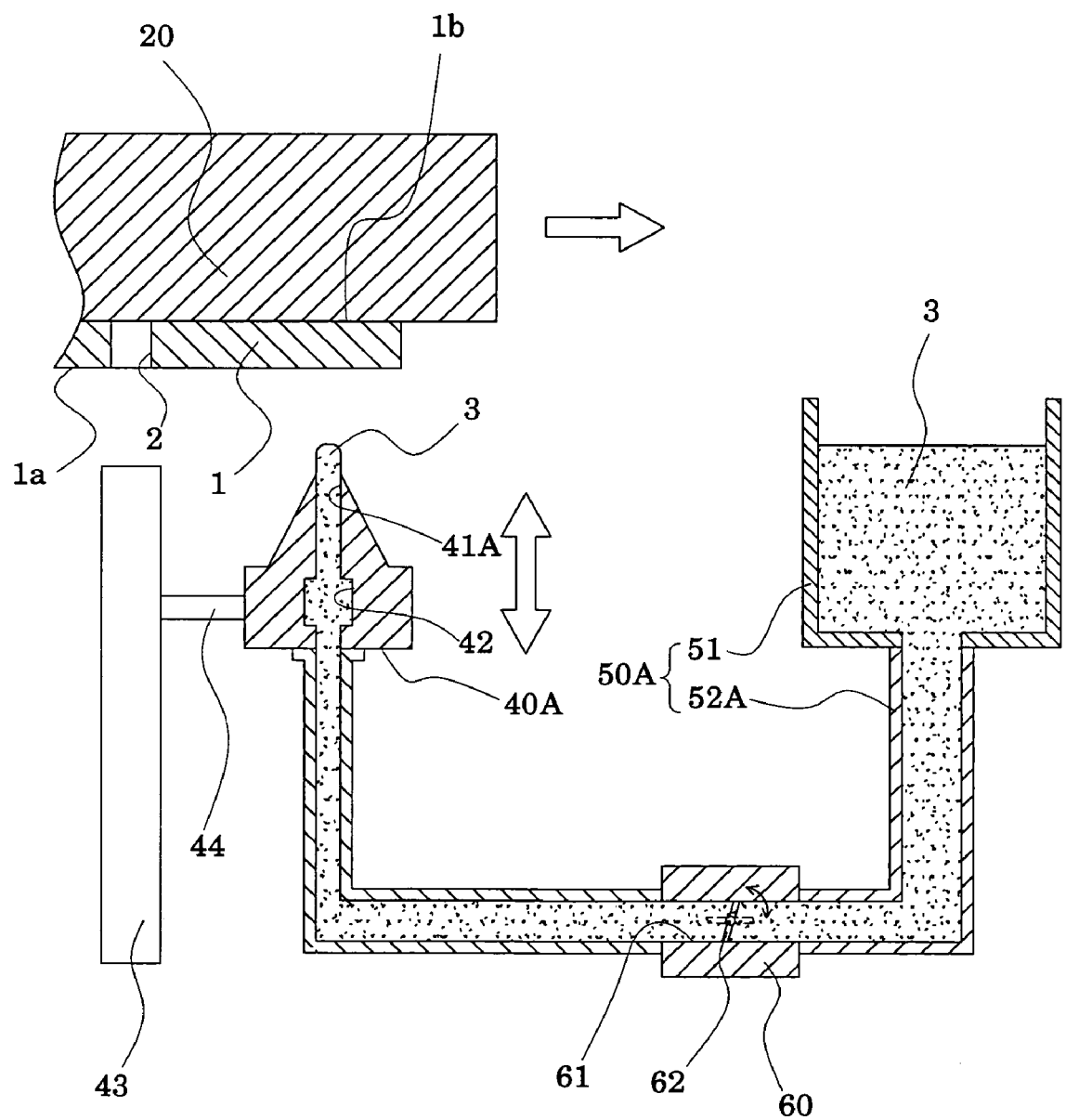
FIG. 19 is a perspective view schematically showing a construction of a coating apparatus according to an embodiment 5 of the present invention.

FIG. 18 is a perspective view schematically showing a construction of a coating apparatus according to an embodiment 5 of the present invention, and FIG. 19 is a cross sectional view of a main portion of the coating apparatus. As shown in FIG. 18, the coating apparatus 10 of this embodiment includes the holding table 20 on which the plate 1 with the through hole 2 penetrating in the thickness direction is held, a coating head 40A which is provided on the plate 1 side of the holding table 20 and includes a plurality of nozzle orifices 41A, reservoir means 50A supplying the coating solution 3 to the coating head 40A, and selection means 60 switching supply of the coating solution 3 from the reservoir means 50A to the coating head 40A to select on/off of the discharge of the coating solution 3 from each of the nozzle openings 41A of the coating head 40A. The selection means 60 may also include a flow rate adjustment function which can adjust the flow rate when the discharge of the coating solution 3 is turned on. Adjusting the discharge rate of the coating solution 3 in this manner can easily realize any thickness of the coating solution 3 applied.

On the coating surface 1a side of the plate 1 held on the holding table 20, the coating head 40A applying the coating solution 3 to the coating surface 1a and the reservoir means 50A containing the coating solution 3 to be supplied to the coating head 40A. In the coating head 40A, the plurality of nozzle orifices 41A, which discharges the coating solution 3, are aligned at positions facing the coating surface 1a of the plate 1 so as to be directed vertically upward. The coating head 40A is arranged such that the alignment direction of the plurality of nozzle orifices 41A intersects with the direction in which the holding table 20 is moving.

Within the coating head 40A, separate solution pools 42 corresponding to the nozzle orifices 41A are provided. When each solution pool 42 is filled with the coating solution 3, the coating solution 3 filled in each solution pool 42 is raised to the edge of each nozzle orifice 41A due to the capillary action. The coating solution 3 raised to the edge of the nozzle orifice 41A remains protruded from the edge of the nozzle orifice 41A due to the surface tension thereof. Furthermore, the coating head 4OA is held through an arm portion 44 on head driving means 43 provided for the apparatus body not shown. This head driving means 43 is composed of a driving motor, a pressure pump for feeding oil or the like, an electromagnet, or the like and holds the coating head 40A through the arm portion 44 so that the coating head 40A is free to move vertically. The distance between the edge of the coating head 40A held by the head driving means 43 and the coating surface 1a of the plate 1 is properly adjusted depending on the kinematic viscosity of the coating solution 3, the wettability of the coating solution 3 to the plate 1, and the like.

The reservoir 50A includes a reservoir tank 51 containing the coating solution 3 and a plurality of supply pipes 52A. One end of each of the supply pipes 52A is connected to the coating head 40A, and the other end thereof is connected to the reservoir tank 51. The plurality of supply pipes 52A are provided to correspond to the respective nozzle orifices 41A of the coating head 40A and supply the coating solution 3 from the reservoir tank 51 to the respective solution pools 42 communicating with the respective nozzle orifices 41A.

The selection means 60, which selectively stops the discharge of the coating solution 3 from each nozzle orifice 41A of the coating head 40A, is provided in the middle of the supply pipes 52A. This selection means 60 includes through holes 61 communicating with the respective supply pipes 52A and open/close valves 62 rotatably provided within the respective through holes 61. The selection means not shown 60 rotates the open/close valves 62 with a valve driving means not shown such as a driving motor to open/close the through holes 61. The selection means 60 opens/closes the through holes 61 by rotating the open/close valves 62 to switch the supply of the coating solution 3 from the reservoir tank 51 to the coating head 40A and selectively stop the discharge of the coating solution 3 from the nozzle orifices 41A of the coating head 40A.

Specifically, when the open/close valves 62 of the selection means 60 open the through holes 61, the solution pools 42 corresponding to the respective nozzle orifices 41A are filled with the coating solution 3 from the reservoir tank 51 through the supply pipes 52A. The coating solution 3 within the solution pools 42 is raised to the edges of the nozzle orifices 41A due to the capillary action as described above and remains protruded at the edges of the nozzle orifices 41A due to the surface tension thereof. In such a state, the coating surface 1a of the plate 1 is brought into contact with the protruded coating solution 3, and the holding table 20 is moved in an in-plane direction of the coating surface 1a of the plate 1 which is orthogonal to the alignment direction of the nozzle orifices 41A. The coating solution is then gradually discharged from the nozzle orifices 41A, and the coating surface 1a of the plate 1 can be coated with the coating solution 3. When the open/close valves 62 of the selection means 60 close the through holes 61, the coating solution 3 is not supplied from the reservoir tank 51 to the solution pools 42 and not discharged from the edges of the nozzle orifices 41A. The open/close valves 62 are selectively driven by the selection means 60 to open/close the through holes 61 in this manner to switch the 'supply of the coating solution 3 from the reservoir tank 51 to the coating head 40A and selectively stop the discharge of the coating solution 3 from the plurality of nozzle orifices 41A. Selectively stopping the discharge of the coating solution 3 from the plurality of nozzle orifices 41A by the selection means 60 in this manner allows the coating solution 3 to be selectively applied to a region of the coating surface 1a of the plate 1 other than the through holes 2. In other words, stopping the discharge of the coating solution 3 from the nozzle orifices 41A corresponding to the through holes 2 can prevent the coating solution 3 from being applied to the regions corresponding to the through holes 2. As described above, in this embodiment, the selection means 60 is the coating preventing means for preventing the coating solution 3 from entering the through holes 2 of the plate 1.

Moreover, selectively stopping the discharge of the coating solution 3 from the plurality of nozzle orifices 41A by the selection means 60 enables the coating solution 3 to be applied to the coating surface 1a of the plate 1 in a desired pattern.

To selectively stop the discharge of the coating solution 3 from each nozzle orifice 41A of the coating head 40A, the selection means 60 selectively opens/closes the through holes 61 by rotating the open/close valves 62 to switch the supply of the coating solution 3 from the reservoir tank 51 to the coating head 40A. However, the selection means 60 can also include a flow rate adjustment function to adjust an opening area when each through hole 61 is opened. Adjusting the opening areas of the through holes 61 allows the flow rate of the coating solution 3 to be arbitrarily adjusted. Adjustment of the flow rate of the coating solution 3 by the selection means 60 as described above enables the thickness of the film of the coating solution 3 applied to the plate 1 to be adjusted into any thickness and as well as enables the plate 1 to be unevenly coated with the coating solution 3.

Figure 20A:
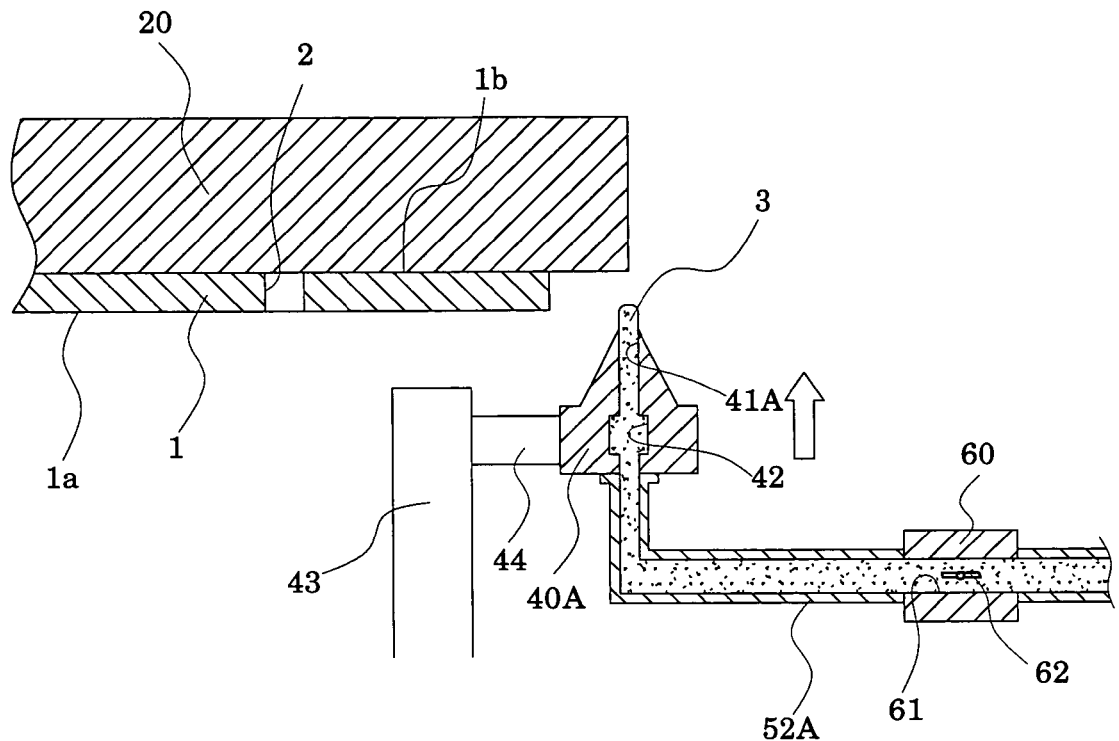
FIGS. 20A and 20B are cross sectional views of a main portion of the coating apparatus according to the embodiment 5 of the present invention.

Herein, a description is given in detail of a coating method using the above described coating apparatus 10. FIGS. 20A and 20B and FIGS. 21A and 21B are cross sectional views of a main portion of the coating apparatus, showing the coating method. As shown in FIG. 20A, the coating head 40A is brought close to the plate 1 by the head driving means 43 until the distance between the coating head 40A and the plate 1 reaches a desired distance in a state where the coating solution 3 is selectively protruded from the nozzle orifices 41A of the coating head 40A by the selection means 60.

In the stand-by state before coating, the coating solution 3 may not be protruded from the edges of the nozzle orifices 41A, which can prevent the coating solution 3 from drying or being mixed with foreign matters. In order to prevent the coating solution 3 from protruding from the edges of the nozzle orifices 41A, the solution pool 42 should not be filled with the coating solution 3. In this embodiment, when the coating head 40A is moved toward the plate 1, the supply of the coating solution 3 from the reservoir tank 51 to the coating head 40A is turned on/off or the amount of the coating solution 3 supplied is adjusted by the selection means 60 to turn on/off the discharge of the coating solution 3 from the edge of each nozzle orifice 41A, select the amount of the coating solution discharged, that is, whether the coating solution is protruded or not, or adjust the amount of the coating solution protruded.

Figure 20B:
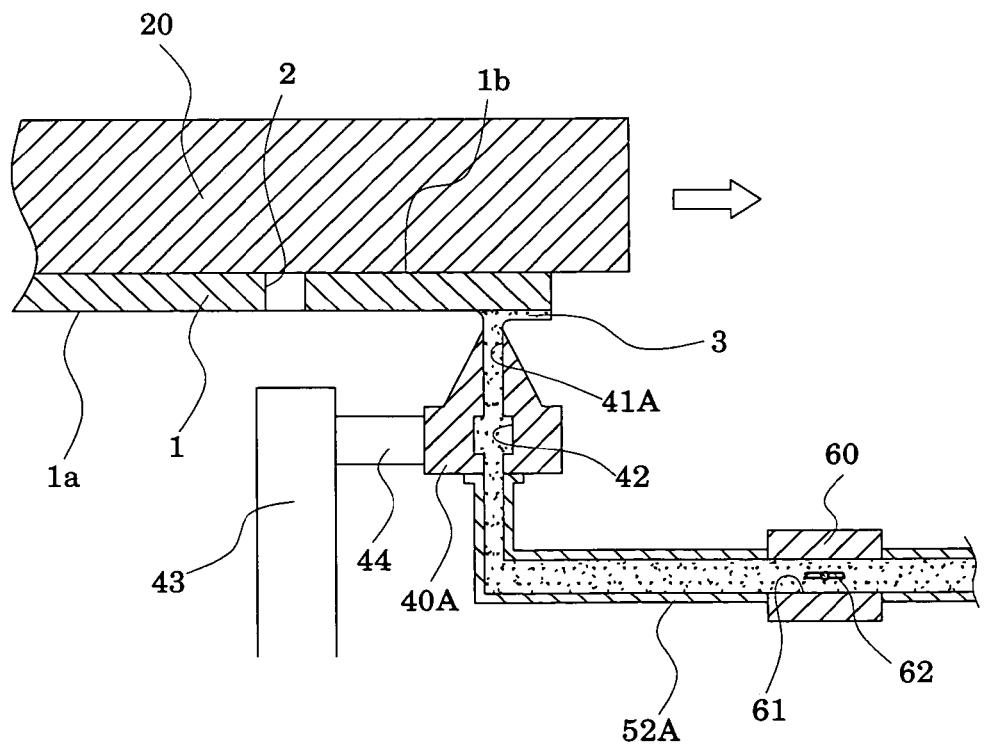
Figure 21A:
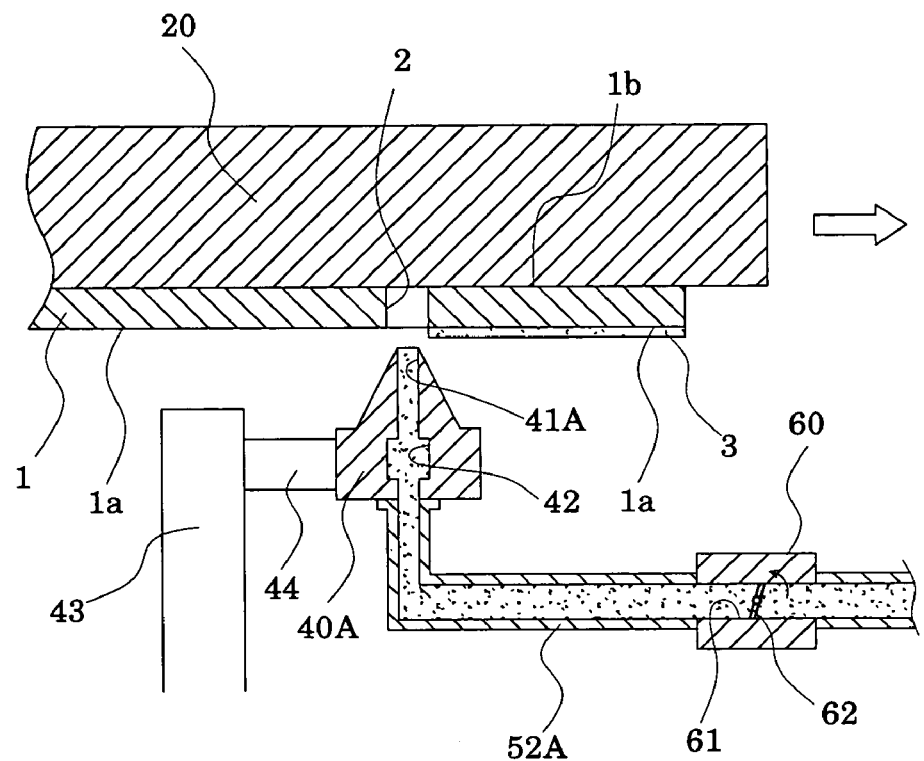
FIGS. 21A and 21B are cross sectional views of the main portion of the coating apparatus showing a coating method according to the embodiment 5 of the present invention.
Figure 21B:
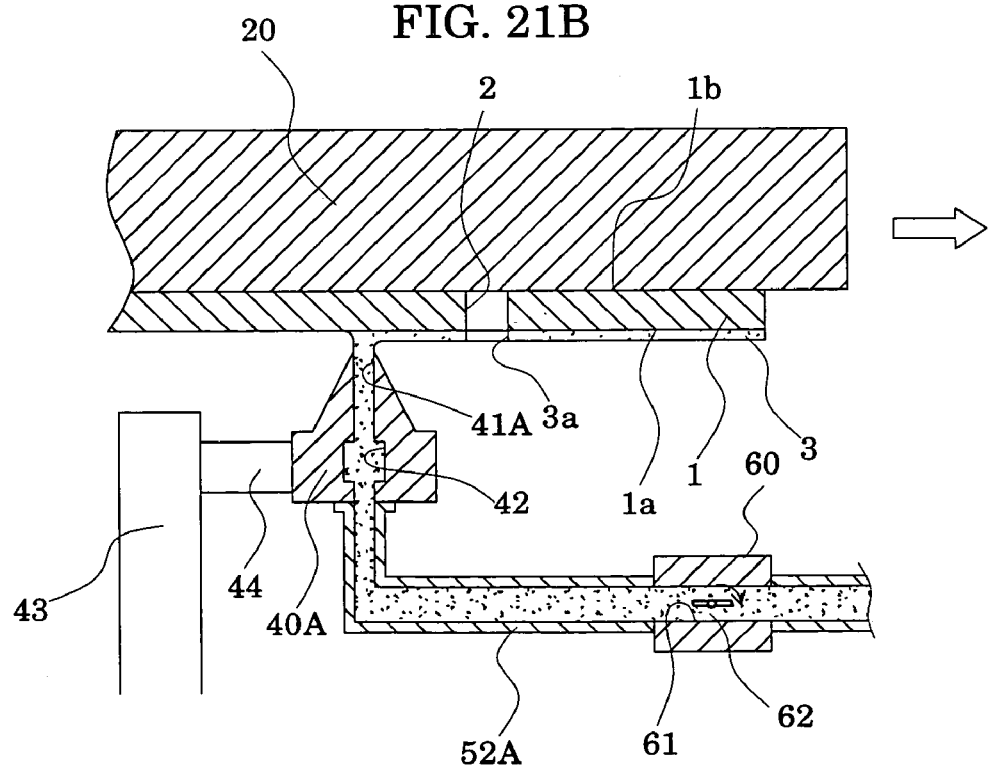

Next, as shown in FIG. 20B, the holding table 20 is moved in an in-plane direction of the coating surface 1a of the plate 1 by a table driving means not shown to start coating the coating surface 1a with the coating solution 3. Next, as shown FIG. 21A, for the nozzle orifice 41A corresponding to the through hole 2 of the plate 1, the selection means 60 closes the through hole 61 with the open/close valve 62. The coating solution 3 from the reservoir tank 51 is not supplied to the nozzle orifice 41A, and the coating solution 3 is not applied to the coating surface 1a of the plate 1. As shown in FIG. 21B, the holding table 20 is moved, and after the nozzle orifice 41A passes the through hole 2, the open/close valve 62 of the selection means 60 opens the through hole 61. The coating solution 3 is thus applied to the coating surface 1a of the plate 1. This enables the coating solution 3 to be applied to the coating surface 1a of the plate 1 other than the through hole 2 so as to have a hole 3a without causing the coating solution 3 entering the through hole 2.

Selectively stopping the discharge of the coating solution from the nozzle orifices 41A in this manner is not limited to the case where the nozzle orifice 41A is corresponding to the through hole 2 of the plate 1. The discharge of the coating solution from the nozzle orifice 41A may be selectively stopped at a desired time in a region not corresponding to the through hole 2. Thus selectively stopping the discharge of the coating solution 3 from one nozzle orifice 41A by the selection means 60 enables the coating solution 3 to be applied in the direction in which the plate 1 is moving in a desired pattern to a region which the foregoing nozzle orifice 41A faces. In the same way, when the selection means 60 selectively stops the discharge of the coating solution 3 from a plurality of the nozzle orifices 41A simultaneously, the coating solution 3 can be applied in a desired pattern in the alignment direction of the nozzle orifices 41A of the coating surface 1a. In other words, selectively stopping the discharge of the coating solution 3 from the plurality of nozzle orifices 41A by the selection means 60 enables the coating solution 3 to be applied to the entire coating surface 1a of the plate 1 in a desired pattern.

Furthermore, the holding table 20 is moved, and the coating surface 1a of the plate 1 is coated with the coating solution 3. Thereafter, the coating head 40A is separated from the plate 1, thus finishing the coating of the coating surface 1a of the plate 1 with the coating solution 3.

As described above, in the coating apparatus 10 of this embodiment, the coating head 40A is provided with the plurality of nozzle orifices 41A, and the discharge of the coating solution 3 from the nozzle orifices 41A is selectively stopped by the selection means 60. The coating solution 3 can be therefore selectively applied to only a region of the plate 1 other than the through holes 2. This can prevent the coating solution 3 from spreading to the inside of the through holes 2 and the holding surface 1b side, which eliminates the need for the step of removing the coating solution 3 in the regions where it is unnecessary including the insides of the through holes 2 and the holding surface 1b. Accordingly, the manufacturing process can be simplified, and the manufacturing cost can be reduced. In addition, since the coating solution 3 can be prevented from spreading the holding surface 1b of the plate 1, the coating solution 3 does not adhere to the holding table 20, which eliminates the step of washing the holding table 20. Accordingly, the manufacturing process can be simplified, and the manufacturing cost can be reduced.

Moreover, the coating apparatus 10 of this embodiment can directly apply the coating solution 3 to the coating surface 1a of the plate 1 in a desired pattern, which eliminates the need for a step of patterning by exposure or etching. Accordingly, the manufacturing method can be simplified, and the manufacturing cost can be reduced.

Furthermore, the selection means 60 of this embodiment is not particularly limited if the selection means 60 is capable of selecting on/off of the discharge of the coating solution 3 from the nozzle orifices 41A to selectively stop the discharge of the coating solution 3 from the nozzle orifices 41A. For example, a small open/close valve opening and closing each nozzle orifice 41A may be provided within the coating head 40A. Such a small open/close valve can be driven by using, for example, a piezoelectric actuator or the like. The shape of the nozzle orifices 41A is not particularly limited, and for example, the opening shape of the nozzle orifices, which discharge the coating solution 3 may be a square, a circle, an ellipse, and the like.

In this embodiment, as the selection means 60, the open/close valves 62 opening and closing the through holes 61 are provided, but the selection means 60 is not limited to this. For example, a feed pump which adjusts the flow rate of the coating solution 3 is provided for each supply pipe 52A, and the supply of the coating solution 3 is switched by this feed pump to selectively discharge the coating solution 3 from each nozzle orifice 41A. When the feed pump is provided as the selection means, whether the solution pool 42 is filled with the coating controlled by the selection means for microvibration: whether the coating solution 3 is protruded from the edge of the nozzle orifice 41 to such an extent that the coating solution 3 is not completely protruded or not protruded. Moreover, for example, micro-vibration of the surface of the coating solution 3 can be made by vertically moving the surface of the coating solution 3 that the reservoir means 5OA keeps with respect to the edges of the nozzle orifices 41A. In this manner, the microvibration of the solution surfaces on the nozzle orifice 41A side can prevent the increase in viscosity of the coating solution 3 which is caused in the rims of the nozzle orifices 41A by drying or mixing with the foreign substances. A desired amount of the coating solution 3 can be therefore discharged from the nozzle orifices 41A. Accordingly, the coating solution 3 increasing in viscosity does not adhere to the rims of the nozzle orifices 41A. It is preferable to take a measure for preventing the increase in viscosity of the coating solution 3 especially when the coating apparatus remains in the stand-by state for a long time.

Embodiment 6

Figure 22:
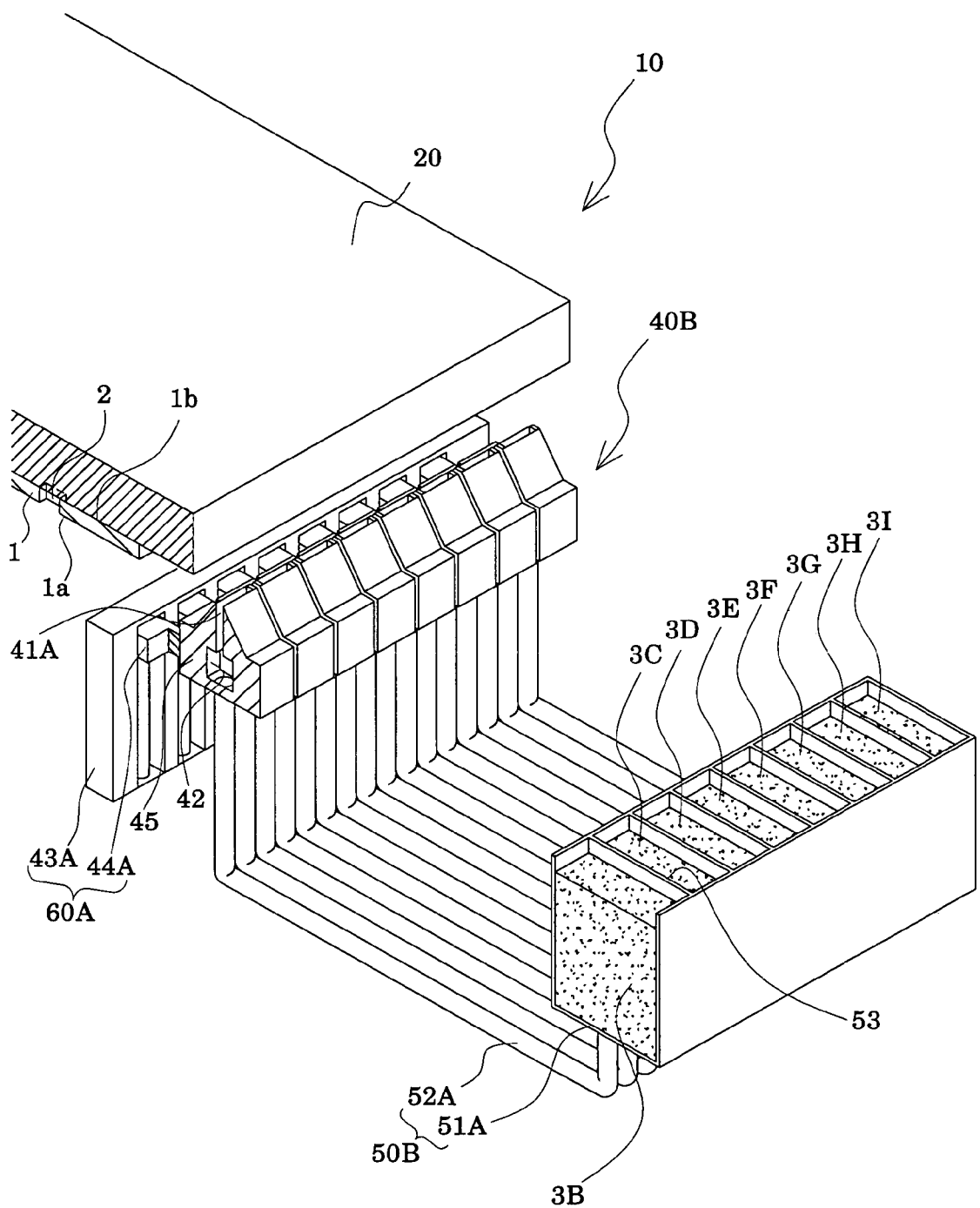
FIG. 22 is a perspective view schematically showing a construction of the coating apparatus according to an embodiment 6 of the present invention.

FIG. 22 is a schematic perspective view of a coating apparatus according to an embodiment 6 of the present invention. As shown in FIG. 22, the coating apparatus 10 of this embodiment includes the holding table 20 on which the plate 1 with the through holes 2 penetrating in the thickness direction is held, a coating head 40B composed of a plurality of individual heads 45 aligned in a straight line in a direction intersecting with the direction in which the holding table 20 is moving, and reservoir means 5OB storing different coating solutions 3B to 3I corresponding to the respective individual heads 45.

Each of the individual heads 45 includes one nozzle orifice 41 and one solution pool 42. The reservoir means 5OB includes reservoir tanks 51A which are partitioned by partition walls 53 and stores the different coating solutions 3B to 3I and the plurality of supply pipes 52A. One end of each of the supply pipes 52A is connected to one of the individual head 45, and the other end thereof is connected so that any one of the coating solutions 3B to 3I of the reservoir tanks 51A is supplied.

The selection means 60A of this embodiment includes arms 44A holding the respective individual heads 45 and driving means 43A vertically moving the arms 44A composed of a driving motor, a pressure pump for feeding oil or the like, an electromagnet, or the like. The selection means 60A vertically moves each individual head 45 with the driving means 43A to adjust the distance between the nozzle orifices 41A and the coating surface 1a of the plate 1, thus selectively stopping the discharge of the coating solutions 3B to 3I from the nozzle orifices 41A. Specifically, when the coating solutions 3B to 3I are not desired to be discharged from the nozzle orifice 41A of the individual head 45, the selection means 60A increases the distances between the nozzle orifices 41A and the coating surface 1a of the plate 1 with the driving means 43A. On the contrary, when the coating solutions 3 are desired to be discharged from the nozzle orifices 41A, the selection means 60A reduces the distances between the nozzle orifices 41A and the coating surface 1a of the plate 1. As described above, in this embodiment, the driving means 43A serves as the selection means 60A.

By selectively stopping the discharge of the coating solutions 3B to 3I from the respective individual heads 45 with the selection means 60A, the coating solutions 3 can be selectively applied to regions of the coating surface 1a of the plate 1 other than the through holes 2. In other words, selectively stopping the discharge of the coating solutions from the nozzle orifices 41A corresponding to the through holes 2 enables the coating solutions 3 to be prevented from being applied to the regions corresponding to the through holes 2. In this embodiment, as described above, the selection means 60A serves as the coating preventing means to prevent the coating solution 3 from entering the through holes 2 of the plate 1.

When discharge of the coating solutions from the nozzle orifices 41A is selectively stopped, the coating surface 1a of the plate 1 can be coated with the different coating solutions 3B to 3I in a desired pattern even in regions of the plate 1 other than the through holes 2. Adjusting the distances between the edges of the nozzle orifices 41A of the individual heads 45 and the coating surface 1a of the plate 1 with the selection means 60A enables adjustment of the thicknesses of the coating solutions 3B to 3I applied. The coating solutions 3B to 3I can be therefore applied to the coating surface 1a of the plate 1 in a minute pattern.

In this embodiment, the selection means 60A selectively stops the discharge of the coating solution 3 from each nozzle orifice 41A by vertically positioning each of the individual heads 45. The selection means 60A is not limited to this and, for example, may also include the same flow rate adjustment function as that of the embodiment 1. In the case of providing the selection means 60 including the flow rate adjustment function, the coating solution 3 can be applied to the coating surface 1a of the plate 1 in any thickness without adjusting the distance between each individual head 45 and the coating surface 1a of the plate 1.

In this embodiment, the plurality of individual heads 45 are aligned in a straight line in the direction intersecting with the direction in which the plate 1 is moving. However, the alignment is not particularly limited to this, and for example, as shown in FIG. 23, the individual heads 45 may be alternately shifted in the direction in which the holding table 20 is moving and aligned in two rows to constitute a coating head 40C. FIG. 23 is a top view showing a modified example of the coating apparatus according to the embodiment 6. Such an arrangement of the individual heads 45 can eliminate gaps between the nozzle orifices 41A adjacent to each other in the alignment direction. It is therefore possible to reliably prevent lines where the coating solution 3 is not applied or the like from being generated on the coating surface 1a of the plate 1.

The selection means 60A of this embodiment is not particularly limited if the selection means 60A can select on/off of the discharge of the coating solutions 3B to 3I from the nozzle orifices 41A to selectively stop the discharge of the coating solutions 3B to 3I from the nozzle orifices 41A. For example, a minute open/close valve opening and closing each nozzle orifice 41A may be provided within each individual head 45. Such a small open/close valve can be driven by using, for example, a piezoelectric actuator or the like. The shape of the nozzle orifices 41A is not particularly limited, and for example, the opening shape of the nozzle orifices 41A, which discharges the coating solutions 3B to 3I, may be a square, a circle, an ellipse, and the like Other Embodiments Hereinabove, each embodiment of the present invention has been described, but the present invention is not limited to the aforementioned embodiments. For example, in the aforementioned embodiments 1 to 6, the coating surface 1a of the plate 1 is directed vertically downward while the nozzle orifices 41 and 41A of the coating heads 40 to 40C are directed vertically upward, but the present invention is not limited to this. For example, the nozzle orifices 41 and 41A of the coating heads 40 to 40C may be directed vertically downward while the coating surface 1a of the plate 1 is directed vertically upward.

In the aforementioned embodiments 1 to 6, the holding table 20 (plate 1) is moved in an in-plane direction of the coating surface 1a to apply the coating solution 3 to the coating surface 1a of the plate, but the present invention is not limited to this. In other words, the coating head 40 is only required to move relative to the holding table 20 in an in-plane direction of the coating surface 1a. For example, the plate 1 may be fixed while the coating heads 40 to 40C are moved in an in-plane direction of the coating surface 1a. Alternatively, both the plate 1 and the coating heads 40 to 40C may be moved.

Furthermore, in the aforementioned embodiments 1 to 5, the head driving means vertically moves the coating heads 40 and 40A toward the holding table 20 to adjust the distances between the edges of the nozzle orifices 41 and 41A and the coating surface 1a of the plate 1, but the present invention is not limited to this. For example, the distances between the coating heads 40 and 40A and the plate 1 may be adjusted by fixing the coating heads 40 or 40A while moving the plate 1 toward the coating heads 40 or 40A. Certainly, the nozzle orifices 41 and 41A of the coating heads 40 and 40A may be directed in a direction intersecting with the vertical direction.

In each of the aforementioned embodiments, the through holes 2 provided in the plate 1 are formed to have a same inner diameter in the thickness direction. The present invention is not particularly limited to this. For example, even when through holes are formed to have inner diameter gradually reduced toward the coating surface side, the coating apparatus 10 of the present invention can prevent the coating solution from entering the through holes, and the coating solution can be applied to the coating surface of the plate in a uniform thickness.

The plate 1 is not limited to one with the coating surface 1a which is planar. For example, the present invention can be also applied to a non-planar plate having a curved coating surface, such as a lens.

What is claimed is:

1. A coating apparatus comprising:
   coating preventing means for forming a repellent film on an inner surface of a through hole by causing a repellent solution to enter from a first direction into of the through hole of a first surface of a plate having the through hole penetrating the plate in a thickness direction;
   a holding table holding the first surface of the plate on which the repellent film is formed; and
   a coating head including a slit-shaped nozzle orifice which discharges a coating solution in a second direction opposite to the first direction, the nozzle orifice facing a second surface of the plate opposite to the first surface of the plate held on the holding table,
   wherein the plate and the coating head are moved relative to each other in an in-plane direction of the second surface of the plate to apply the coating solution on the second surface of the plate.

2. The coating apparatus according to claim 1, wherein the coating preventing means also forms the repellent film on the first surface of the plate.

3. The coating apparatus according to claim 1, wherein the coating preventing means sprays the repellent solution to be the repellent film from the first surface side of the plate.

4. The coating apparatus according to claim 1, further comprising drying means for drying the coating solution.

5. The coating apparatus according to claim 1, wherein the coating head applies a coating solution to be formed into a resist film to the plate.

* * * * *